(12) United States Patent
Lee et al.

(10) Patent No.: US 11,489,042 B2
(45) Date of Patent: Nov. 1, 2022

(54) SEMICONDUCTOR DEVICE

(71) Applicant: POWER MASTER SEMICONDUCTOR CO., LTD., Bucheon-si (KR)

(72) Inventors: Jaegil Lee, Incheon (KR); Sangtae Han, Incheon (KR)

(73) Assignee: POWER MASTER SEMICONDUCTOR CO., LTD., Bucheon-si (KR)

( * ) Notice: Subject to any disclaimer, the term of this patent is extended or adjusted under 35 U.S.C. 154(b) by 0 days.

(21) Appl. No.: 17/091,020

(22) Filed: Nov. 6, 2020

(65) Prior Publication Data
US 2021/0296437 A1 Sep. 23, 2021

(30) Foreign Application Priority Data
Mar. 19, 2020 (KR) .................. 10-2020-0033888

(51) Int. Cl.
*H01L 29/06* (2006.01)
*H01L 29/78* (2006.01)
(Continued)

(52) U.S. Cl.
CPC ...... *H01L 29/0634* (2013.01); *H01L 21/2253* (2013.01); *H01L 21/266* (2013.01);
(Continued)

(58) Field of Classification Search
CPC ........... H01L 29/0634; H01L 29/66712; H01L 29/7811; H01L 29/1095; H01L 29/402;
(Continued)

(56) References Cited

U.S. PATENT DOCUMENTS

| 6,888,195 B2 * | 5/2005 | Saito | ................... | H01L 29/0634 |
| | | | | 257/328 |
| 7,420,245 B2 * | 9/2008 | Yamashita | .......... | H01L 29/0634 |
| | | | | 257/328 |

(Continued)

FOREIGN PATENT DOCUMENTS

| CN | 109755291 | 5/2019 |
| JP | 2012-160752 | 8/2012 |

OTHER PUBLICATIONS

B. Jayant Baliga, "Fundamentals of Power Semiconductor Devices", Springer, along with cover pages/Preface/p. 436–442. https://doi.org/10.1007/978-3-319-93988-9.

*Primary Examiner* — Phat X Cao
*Assistant Examiner* — Victor V Barzykin
(74) *Attorney, Agent, or Firm* — Lex IP Meister, PLLC

(57) ABSTRACT

A semiconductor device is provided. A semiconductor device includes: a first semiconductor layer having an N-type conductivity; and a second semiconductor layer that is formed on the first semiconductor layer, wherein an active region is defined in the first semiconductor layer and the second semiconductor layer, the active region includes a plurality of first P pillars and a plurality of first N pillars alternately arranged along a first direction, in the active region, an upper pillar region including an upper region of the plurality of first P pillars and an upper region of the plurality of first N pillars, a lower pillar region including a lower region of the plurality of first P pillars and a lower region of the plurality of first N pillars, and a middle pillar region formed between the upper pillar region and the lower pillar region are defined, the entire charge amount of the upper pillar region is greater than the entire charge amount of the lower pillar region, and a P-type charge amount is greater than an N-type charge amount in the upper pillar (Continued)

region, while the N-type charge amount is greater than the P-charge amount in the lower pillar region.

10 Claims, 25 Drawing Sheets

(51) Int. Cl.
*H01L 29/66* (2006.01)
*H01L 21/266* (2006.01)
*H01L 21/225* (2006.01)
*H01L 21/265* (2006.01)

(52) U.S. Cl.
CPC .. *H01L 21/26513* (2013.01); *H01L 29/66712* (2013.01); *H01L 29/7811* (2013.01)

(58) Field of Classification Search
CPC ........... H01L 21/2253; H01L 21/26513; H01L 21/266
See application file for complete search history.

(56) References Cited

U.S. PATENT DOCUMENTS

| | | | | |
|---|---|---|---|---|
| 7,642,597 | B2* | 1/2010 | Saito | H01L 29/7811 257/341 |
| 7,737,469 | B2* | 6/2010 | Saito | H01L 29/7395 257/197 |
| 7,759,732 | B2* | 7/2010 | Saito | H01L 29/7811 257/341 |
| 8,058,688 | B2* | 11/2011 | Ono | H01L 29/7802 257/341 |
| 8,188,521 | B2* | 5/2012 | Saito | H01L 29/0634 257/288 |
| 8,598,657 | B2* | 12/2013 | Tamaki | H01L 29/0878 257/342 |
| 8,680,608 | B2* | 3/2014 | Saito | H01L 29/0873 257/329 |
| 8,772,869 | B2* | 7/2014 | Saito | H01L 29/7802 257/342 |
| 8,823,083 | B2* | 9/2014 | Kagata | H01L 29/7827 257/329 |
| 10,128,637 | B2 | 11/2018 | Makino et al. | |
| 2008/0135930 | A1 | 6/2008 | Saito | |
| 2008/0150073 | A1 | 6/2008 | Willmeroth et al. | |
| 2008/0246079 | A1* | 10/2008 | Saito | H01L 29/0634 257/328 |
| 2012/0299094 | A1 | 11/2012 | Lee et al. | |

* cited by examiner

SEMICONDUCTOR DEVICE

CROSS-REFERENCE TO RELATED APPLICATION

This application claims priority to and the benefit of Korean Patent Application No. 10-2020-0033888 filed in the Korean Intellectual Property Office on Mar. 19, 2020, the entire contents of which are incorporated herein by reference.

BACKGROUND

(a) Technical Field

The present disclosure relates to a semiconductor device.

(b) Description of the Related Art

A power-type metal oxide semiconductor field effect transistor (MOSFET) may be used as a switch, and requires low on-resistance, a high breakdown voltage, and high switching speed. In particular, a super-junction MOSFET, which is a representative example of a high breakdown voltage MOSFET, is a kind of Si-MOSFET, and has a high speed switching operation at relatively low power compared to an insulated gate bipolar transistor (IGBT).

By improving the fact that when the breakdown voltage is increased, a drift layer is thickened and thus on-resistance is increased in a planar MOSFET, the super-junction MOSFET alternately disposes a plurality of vertical PN junctions to reduce on-resistance, and a reduction of the amount of gate charge required to charge the input capacitance, which is the sum of the gate-source capacitance and the gate-drain capacitance, can be realized.

A gate of the MOSFET is insulated from a drain and a source by a gate oxide layer, and since a PN junction is formed through a substrate between the drain and the source, parasitic capacitance exists due to the structure of the MOSFET. The parasitic capacitance may be a parameter that limits the frequency and switching speed of the super-junction MOSFET.

However, for example, in order to increase the switching speed, or for other design purposes, it may be necessary to down-size a chip in which the super-junction MOSFET is implemented. In such a case, the switching speed increases because down-sizing of the chip reduces the capacitance between the gate and drain in the super-junction MOSFET, but at the same time, electromagnetic interference (EMI) problems, problems of increasing voltage overshoot, problems of increasing gate voltage oscillation or spiking, and the like may occur. Accordingly, there is a need for a design method of a super-junction MOSFET (hereinafter referred to as super-junction semiconductor device) capable of removing or mitigating such problems while realizing down-sizing of the chip.

SUMMARY

The present disclosure has been made in an effort to provide a super-junction semiconductor device having excellent reliability and stability while down-sizing a chip.

A semiconductor device according to an exemplary embodiment of the present disclosure includes: a first semiconductor layer having an N-type conductivity; and a second semiconductor layer that is formed on the first semiconductor layer, wherein an active region is defined in the first semiconductor layer and the second semiconductor layer, the active region includes a plurality of first P pillars and a plurality of first N pillars alternately arranged along a first direction, in the active region, an upper pillar region including an upper region of the plurality of first P pillars and an upper region of the plurality of first N pillars, a lower pillar region including a lower region of the plurality of first P pillars and a lower region of the plurality of first N pillars, and a middle pillar region formed between the upper pillar region and the lower pillar region are defined, the entire charge amount of the upper pillar region is greater than the entire charge amount of the lower pillar region, and a P-type charge amount is greater than an N-type charge amount in the upper pillar region, while the N-type charge amount is greater than the P-charge amount in the lower pillar region.

In some exemplary embodiments of the present disclosure, the P-type charge amount from an upper end of the upper pillar region to a lower end of the lower pillar region may decrease with a first slope, and the N-type charge amount may decrease with a second slope that is lower than the first slope. The P-type charge amount and the N-type charge amount may linearly decrease from an upper end of the upper pillar region to a lower end of the lower pillar region.

In some exemplary embodiments of the present disclosure, the P-type charge amount may non-linearly decrease and the N-type charge amount may linearly decrease from an upper end of the upper pillar region to a lower end of the lower pillar region.

In some exemplary embodiments of the present disclosure, the P-type charge amount may linearly decrease and the N-type charge amount non-linearly decreases from an upper end of the upper pillar region to a lower end of the lower pillar region.

In some exemplary embodiments of the present disclosure, the P-type charge amount and the N-type charge amount non-linearly decrease from an upper end of the upper pillar region to a lower end of the lower pillar region.

In some exemplary embodiments of the present disclosure, the middle pillar region may include a charge amount balanced region where the P-type charge amount and the N-type charge amount are balanced.

In some exemplary embodiments of the present disclosure, the semiconductor device may further include: a source electrode formed on the second semiconductor layer; and a drain electrode formed below the first semiconductor layer, wherein a charge pocket may be formed in the first N pillar while a drain voltage applied through the drain electrode and the source electrode is increased.

In some exemplary embodiments of the present disclosure, a frame region may be further defined in the first semiconductor layer and the second semiconductor layer, and the frame region may include a plurality of second P pillars and a plurality of second N pillars alternately arranged along the first direction.

In some exemplary embodiments of the present disclosure, a termination region may be further defined in the first semiconductor layer and the second semiconductor layer, and the termination region may include a plurality of third P pillars and a plurality of third N pillars alternately arranged along the first direction.

A semiconductor device according to an exemplary embodiment of the present disclosure includes: a first semiconductor layer having N-type conductivity; and a second semiconductor layer formed on the first semiconductor layer, wherein an active region is defined in the first semiconductor layer and the second semiconductor layer, the active region includes a plurality of first P pillars and a plurality of first N pillars alternately arranged along a first direction, an upper pillar region including an upper region of the plurality of first P pillars and an upper region of the plurality of first N pillars is defined in the active region, the entire charge amount of an upper end of the upper pillar region may be greater than the entire charge amount of a lower end of the upper pillar region, and a P-type charge amount may be greater than an N-type charge amount in the upper pillar region.

In some exemplary embodiments of the present disclosure, the P-type charge amount and the N-type charge amount may linearly decrease from the upper end to the lower end of the upper pillar region.

In some exemplary embodiments of the present disclosure, the P-type charge amount non-linearly decreases and the N-type charge amount may linearly decrease from the upper end to the lower end of the upper pillar region.

In some exemplary embodiments of the present disclosure, the P-type charge amount linearly decreases and the N-type charge amount may non-linearly decrease from the upper end to the lower end of the upper pillar region.

In some exemplary embodiments of the present disclosure, the P-type charge amount and the N-type charge amount may non-linearly decrease from the upper end to the lower end of the upper pillar region.

A semiconductor device according to an exemplary embodiment of the present disclosure includes: a first semiconductor layer having an N-type conductivity; and a second semiconductor layer that is formed on the first semiconductor layer, wherein an active region is defined in the first semiconductor layer and the second semiconductor layer, the active region includes a plurality of first P pillars and a plurality of first N pillars alternately arranged along a first direction, a lower pillar region including a lower region of the plurality of first P pillars and a lower region of the plurality of first N pillars is defined in the active region, the entire charge amount of an upper end of the lower pillar region may be greater than the entire charge amount of a lower end of the lower pillar region, and an N-type charge amount may be greater than a P-type charge amount in the lower pillar region.

In some exemplary embodiments of the present disclosure, the P-type charge amount and the N-type charge amount may linearly decrease from the upper end to the lower end of the lower pillar region.

In some exemplary embodiments of the present disclosure, the P-type charge amount may non-linearly decrease and the N-type charge amount may linearly decrease from the upper end to the lower end of the lower pillar region.

In some exemplary embodiments of the present disclosure, the P-type charge amount may linearly decrease and the N-type charge amount may non-linearly decrease from the upper end to the lower end of the lower pillar region.

In some exemplary embodiments of the present disclosure, the P-type charge amount and the N-type charge amount may non-linearly decrease from the upper end to the lower end of the lower pillar region.

According to the exemplary embodiments of the present disclosure, an upper portion with reference to the center of the active region ACT pillar is P-rich and a lower portion is N-rich while the P-type charge amount and the N-type charge amount are balanced near the center of the active region ACT pillar in the vertical direction, and the charge amount is gradually increased in the upper portions of the P pillar and the N pillar in the vertical direction and the charge amount is gradually decreased in the lower portions of the P pillar and the N pillar such that, during a turn-off switching operation, an increasing speed of a width of a depletion layer in the upper region of the N pillar according to an increase of a drain voltage is set to be slowed down, to thereby accelerate formation of a charge pocket and increase a parasitic capacitance value $C_{GD}$ due to the charge pocket.

Accordingly, the drain voltage $V_{DS}$ can be prevented from being rapidly changed due to the effect of increasing the parasitic capacitance value $C_{GD}$ while down-sizing the chip, and thus the EMI characteristic, overshoot of the drain voltage $V_{DS}$, and oscillation or spiking of the gate voltage $V_{GS}$ can be remarkably improved. In addition, the semiconductor device according to the exemplary embodiments of the present disclosure has a unique symmetry that increases the amount of charge in both the P pillar and the N pillar toward the top of the active area (ACT), and decreases the amount of charge in both the P pillar and the N pillar toward the bottom, and thus it is possible to minimize negative effects such as a decrease in $BV_{DSS}$ or a change in the resistance value $R_{DS(ON)}$ of an element device according to the charge amount imbalance. Accordingly, the semiconductor device according to the exemplary embodiments of the present disclosure can secure reliability and stability while realizing down-sizing of the chip.

DETAILED DESCRIPTION

Figure 1:
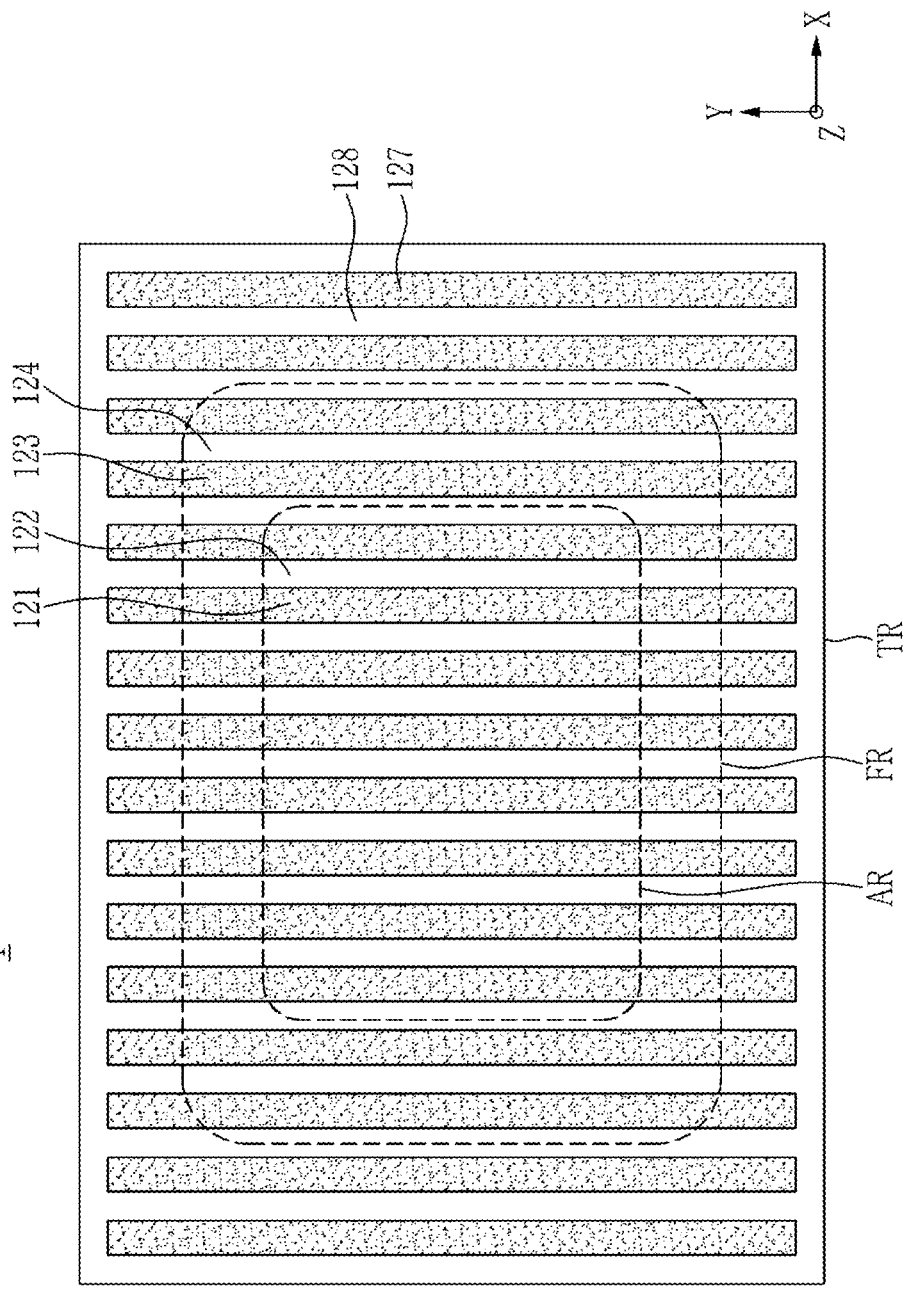
FIG. 1 is a top plan view provided for description of a semiconductor device according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

In addition, unless explicitly described to the contrary, the word "comprise" and variations such as "comprises" or "comprising" will be understood to imply the inclusion of stated elements but not the exclusion of any other elements.

Although exemplary embodiments of the present disclosure are mainly described with an example of a super-junction semiconductor device, the technical spirit of the present disclosure is not limited thereto, and the present disclosure can be applied to other types of power switch technologies including IGBT devices, Schottky rectifiers, various types of bipolar switches, and various types of thyristors and rectifiers. In addition, although exemplary embodiments of the present disclosure are described using a specific P region and N region, the technical spirit of the present disclosure is not limited thereto, and the technical spirit of the present disclosure may also be applied to a semiconductor device of an opposite conductivity type in the corresponding region. Hereinafter, the term, "semiconductor device" refers to a super-junction MOSFET and a super-junction semiconductor device, except where specifically noted.

FIG. 1 is a top plan view provided for description of a semiconductor device according to an exemplary embodiment of the present disclosure.

Referring to FIG. 1, a semiconductor device 1 according to an exemplary embodiment of the present disclosure may include an active region AR, a frame region FR, and a termination region TR.

The active region AR may include first P-pillars 121 and first N-pillars 122 alternately arranged along a first direction X. That is, the active region AR may include a plurality of first P-pillars 121 and first N-pillars 122 formed between the plurality of first P-pillars 121.

The termination region TR may include third P-pillars 127 and third N-pillars 128 alternately arranged along the first direction X. That is, the termination region TR may include a plurality of third P-pillars 127 and third N-pillars 128 formed between the plurality of third P-pillars 127.

The frame region FR may correspond to a transition region disposed between the active region AR and the termination region TR. The frame region FR may include second P-pillars 123 and second N-pillars 124 alternately arranged along the first direction X. That is, the frame region FR may include a plurality of second P-pillars 123 and second N-pillars 124 formed between the plurality of second P-pillars 123.

In the present exemplary embodiment, the frame region FR is formed to surround the active region A and the termination region TR is formed to surround the frame region FR, but the range of the present disclosure is not limited thereto.

Such a layout of the first P-pillars 121 and the first N-pillars 122 of the active region AR, a layout of the second P-pillars 123 and the second N-pillars 124 of the frame region FR, and a layout of the third P-pillars 127 and the third N-pillars 128 of the termination region TR are not limited to the layouts shown in FIG. 1, and it can be understood that various modifications may be made according to specific implementation purposes, and accordingly, characteristics of the semiconductor device 1 may vary.

Figure 2:
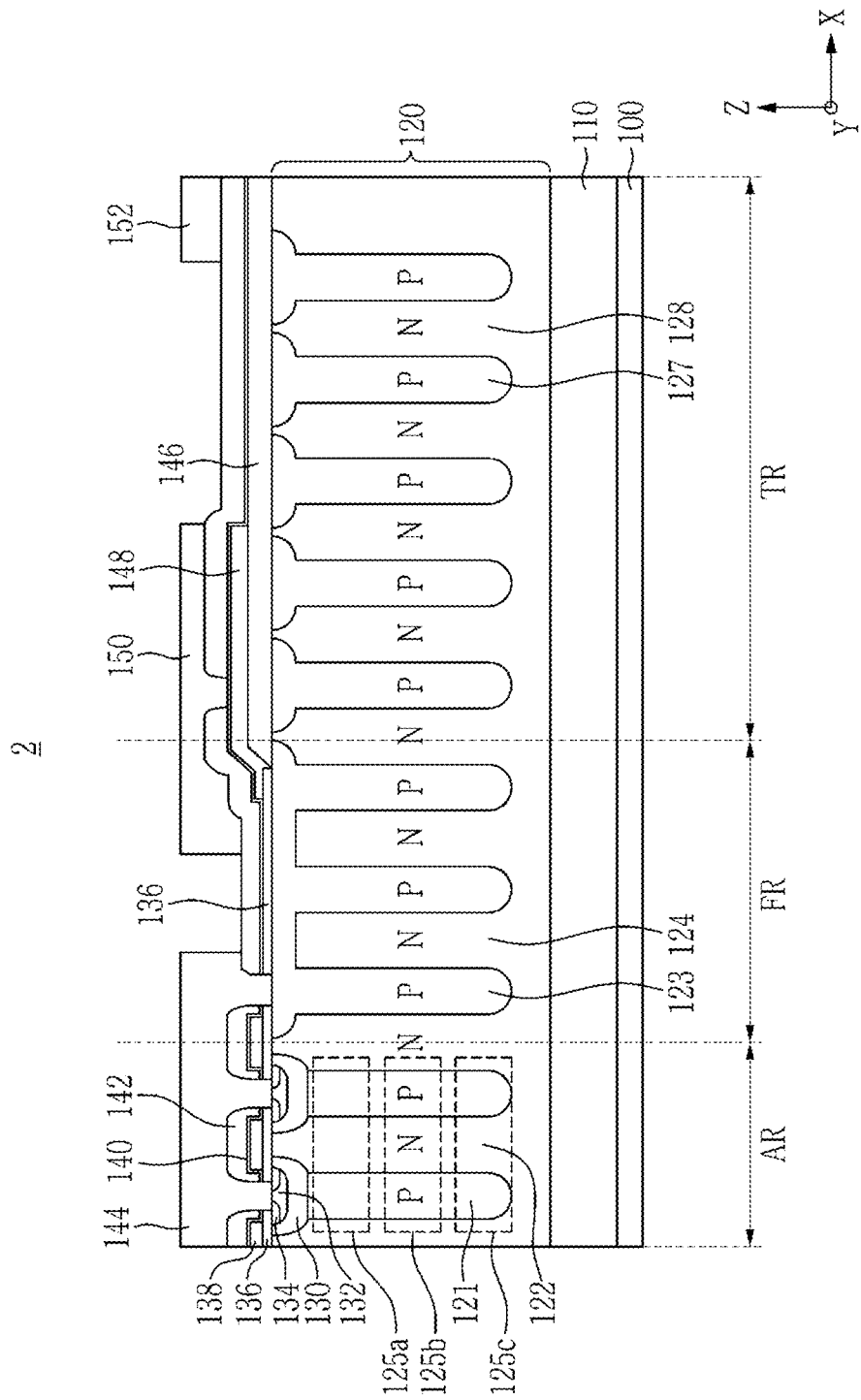
FIG. 2 is a cross-sectional view for description of a semiconductor device according to an exemplary embodiment of the present disclosure.

FIG. 2 is a cross-sectional view for description of a semiconductor device according to an exemplary embodiment of the present disclosure.

Referring to FIG. 2, a semiconductor device 2 according to an exemplary embodiment of the present disclosure may include a first semiconductor layer 110 and a second semiconductor layer 120. The active region AR, the frame region FR, and the termination region TR, which have been described above with reference to FIG. 1, may respectively include a first semiconductor layer 110 and a second semiconductor layers 120.

The first semiconductor layer 110 is formed on a drain electrode 100, and may be divided into the active region AR, the frame region FR, and the termination region TR, which have been described above with reference to FIG. 1. The first semiconductor layer 110 may have an N-type of conductivity. For example, the first semiconductor layer 110 may be a part of a semiconductor substrate that is heavily doped with an N-type impurity. Alternatively, although not shown, the first semiconductor layer 110 may refer to a semiconductor substrate that is heavily doped with N-type impurities and an epitaxial layer that is heavily doped with N-type impurities formed on the semiconductor substrate.

The second semiconductor layer 120 may be divided into the active region AR, the frame region FR, and the termination region TR, which have been described above with reference to FIG. 1.

A portion of the second semiconductor layer 120, corresponding to the active region AR, may correspond to a drift layer. That is, the active region AR of the second semiconductor layer 120 may have a super-junction structure in which first P-pillars 121 including P-type impurities and first N-pillars 122 including N-type impurities are alternately arranged along a first direction X that is parallel with the top surface of the first semiconductor layer 110. That is, the active region AR of the second semiconductor layer 120 may include a plurality of first P-pillars 121 and first N-pillars 122 formed between the plurality of first P-pillars 121.

The first P-pillars 121 and the first N-pillars 122 may extend in a second direction Y that is perpendicular to the first direction X, while having a predetermined width in the first direction X.

In some exemplary embodiments of the present disclosure, concentration of the P-type impurity of the first P-pillar 121 may be the same as that of the N-type impurity of the first N-pillar 122. In addition, the width of the first P-pillar 121 in the first direction X may be the same as that of the first N-pillar 122 in the first direction X. In some exemplary embodiments of the present disclosure, the P-type impurity concentration of the first P-pillar 121 may be higher than the N-type impurity concentration of the first N-pillar 122, and the width of the P-pillar 121 in the first direction X may be narrower than the width of the first N-pillar 122 in the first direction X. Alternatively, in some exemplary embodiments of the present disclosure, the P-type impurity concentration of the first P-pillar 121 may be lower than the N-type impurity concentration of the first N-pillar 122, and the width of the P-pillar 121 in the first direction X may be wider than the width of the first N-pillar 122 in the first direction X. In any case, the impurity concentration and width may be appropriately adjusted so that the P-type charge amount and the N-type charge amount of the active region AR of the second semiconductor layer 120 can be balanced.

A P body region 130 may be formed on the first P-pillar 121, and a P+ region 132 may be formed in the P body region 120. Two N+ regions 134 that are distanced from each other while having a predetermined depth from the top surface of the second semiconductor layer 120 may be formed in the P+ region 132.

A gate dielectric layer 136 may be formed on the first N-pillar 122, and an active poly gate 138 may be formed on the gate dielectric layer 136. A spacer 140 may be conformally formed on the active poly gate 138, and the spacer 140 may include, for example, a silicon nitride. An insulation layer 142 may be formed on the spacer 140. A source electrode 144 may be formed on the insulation layer 142, and the source electrode 144 may be electrically connected with the P+ region 132 by contacting the same.

A structure formed on the first P-pillar 121 and the first N-pillar 122 may not be limited to the above-described structure, and may be modified depending on specific implement purposes.

As described above with reference to FIG. 1, the frame region FR of the second semiconductor layer 120 may be formed to surround the active region AR of the second semiconductor layer 120.

The frame region FR of the second semiconductor layer 120 may include second P-pillars 123 and second N-pillars 124 that are alternately arranged along the first direction X that is parallel with the top surface of the first semiconductor layer 110. That is, the frame region FR of the second semiconductor layer 120 may include a plurality of second P-pillars 123 and second N-pillars 124 formed between the plurality of second P-pillars 123.

The second P pillar 123 and the second N pillar 124 may extend in a second direction Y that is perpendicular to the first direction X, while each having a predetermined width in the first direction X.

In some exemplary embodiments of the present disclosure, the width of the second P-pillar 123 and the second N-pillar 124 in the first direction X and the impurity concentration of the second P-pillar 123 and the second N-pillar 124 may be the same as the width of the first direction of the first P-pillar 121 and the first N-pillar 122 of the active region AR in the first direction X and the impurity concentration of the first P-pillar 121 and the first N-pillar 122. Alternatively, the width and the impurity concentration of each of the second P-pillar 123 and the second N-pillar 124 in the first direction X may be different from the width and the impurity concentration of each of the first direction of the first P-pillar 121 and the first N-pillar 122 of the active region AR in the first direction X, and the impurity concentration and the width may be appropriately adjusted so as to balance the P-type charge amount and the N-type charge amount included in the frame region FR.

A spacer 140 and an insulation layer 142 may be formed on the second semiconductor layer 120 in the frame region FR. At least a part of the insulation layer 142 may correspond to a region where the source electrode 144 and a gate electrode 150 are not formed. That is, the source electrode 144 and the gate electrode 150 may be formed apart from each other. In addition, a region that contacts the source electrode 144 and thus forms an electrical connection with the source electrode 144 may exist on the second semiconductor layer 120.

A structure formed on the second semiconductor layer 120 may be variously modified depending on detailed implementation purposes rather than being limited to the above-stated structure. For example, a field oxide layer 146 may be additionally formed before the insulation layer 142 is formed, or the spacer 140 may be formed with a shape that is different from the shape shown in FIG. 2.

In the present exemplary embodiment, the second P-pillar 123 may be connected to the top surface of the second semiconductor layer 120. Accordingly, a plurality of second P-pillars 123 may contact the source electrode 144 through the upper surface of the second semiconductor layer 120 to form an electrical connection.

Meanwhile, in the present exemplary embodiment, at least a part of the plurality of second P pillars 123 may be electrically connected with each other in an upper portion of the second semiconductor layer 120. For example, three second P-pillars 123 are connected with each other, and thus they may have the shape as shown in 2, but the number and specific shape of the second P-pillars 123 may vary rather than being limited to the number and specific shape shown in FIG. 2.

As previously described with reference to FIG. 1, the termination region TR of the second semiconductor layer 120 may be formed to surround the frame region FR of the second semiconductor layer 120.

The termination region TR of the second semiconductor layer 120 may include third P-pillars 127 and third N-pillars 128 that are alternately arranged along the first direction X that is parallel with the top surface of the first semiconductor layer 110. That is, the termination region TR of the second semiconductor layer 120 may include a plurality of third P-pillars 127 and a plurality of third N-pillars 128 formed between the plurality of third P-pillars 127.

In the termination region TR, the second semiconductor layer 120 may have a super-junction structure in which the third P-pillars 127 including P-type impurities and the third N-pillars 128 including N-type impurities are alternately arranged along the first direction X that is parallel with the top surface of the first semiconductor layer 110, and thus a breakdown voltage of the semiconductor device 2 may be increased.

The third P pillar 127 and the third N pillar 128 each has a predetermined width in the first direction X, and may extend in the second direction Y that is perpendicular to the first direction X.

In some exemplary embodiments of the present disclosure, the width and the impurity concentration of the third P-pillar 127 and the third N-pillar 128 in the first direction X may be the same as the width and the impurity concentration of the first P-pillar 121 and the first N-pillar 122 in the first direction X of the active region AR. Alternatively, the first direction X width and the impurity concentration of the third P-pillar 127 and the third N-pillar 128 may be different from the first direction X width and the impurity concentration of the first P-pillar 121 and the first N-pillar 122 of the active region AR, and the impurity concentration and width may be appropriately selected to balance the P-type charge amount and the N-type charge amount included in the termination region TR.

A field oxide layer 146 may be formed on the second semiconductor layer 120 in the termination region TR, and the spacer and the insulation layer 142 may be formed on the field oxide layer 146. In particular, in some area on the second semiconductor layer 120 in the termination region 126 TR, a field plate 148 may be formed on the field oxide layer 146, and the spacer 140 and the insulation layer 142 may be formed on the field plate 148. A gate electrode 150 may be formed on the insulation layer 142, and the gate electrode 150 may be electrically connected with the field plate 148 by contacting the same.

Meanwhile, a floating electrode 152 may be formed at a distance from the gate electrode 150 on the field oxide layer 146. The floating electrode 152 is located at the end of the termination region TR, and can serve as a field stop layer to stop the electric field. Although the floating electrode 150 is referred to as a floating electrode 150 in the sense that it is not connected with an outer terminal of a chip included in the semiconductor device 2, it does not mean that the floating electrode 150 is electrically floating. For example, the silicon (Si) region formed in some areas of the chip of the floating electrode 150 may be electrically contacted.

The structure formed on the second semiconductor layer 120 in the termination region TR is not limited to the above-described structure, and may be modified as much as the specific implementation purpose.

An upper pillar region 125a, a middle pillar region 125b, and a lower pillar region 125c may be defined in the active region AR of the second semiconductor layer 120.

The upper pillar region 125a may include an upper region of the first P pillar 121 and an upper region of the first N pillar 122, and the lower pillar region 125c may include a lower region of the first P pillar 121 and a lower region of the first N pillar 122. In addition, the middle pillar region 125b may be formed between the upper pillar region 125a and the lower pillar region 125c.

In the present exemplary embodiment, the entire charge amount of the upper pillar region 125a may be greater than the entire charge amount of the lower pillar region 125c. Here, the meaning of the entire charge amount may mean the sum of the P-type charge amount and the N-type charge amount.

That is, the entire charge amount due to doping in the upper region of the first P pillar 121 and the upper region of the first N pillar 122 may be greater than the entire charge amount due to doping in the lower region of the first P pillar 121 and the lower region of the first N pillar 122.

In addition, the charge amount may be increased closer to an upper end of the upper pillar region 125a and may be decreased closer to a lower end of the lower pillar region 125c. That is, the charge amount is increased closer to the upper region of the first P pillar 121 and the upper region of the first N pillar 122, and is decreased closer to the lower region of the first P pillar 121 and the lower region of the first N pillar 122.

Meanwhile, in the present exemplary embodiment, a P-type charge amount may be greater than an N-type charge amount in the upper pillar region 125a, and the P-type charge amount may be greater than the N-type charge amount in the lower pillar region 125c. That is, the P-type charge amount may be greater than the N-type charge amount in the upper region of the first P pillar 121 and the upper region of the first N pillar 122, and the N-type charge amount may be greater than the P-type charge amount in the lower region of the first P pillar 121 and the lower region of the first N pillar 122.

Accordingly, the charge amounts in the first P pillar 121 and in the first N pillar 122 may be distributed as follows. The P-type charge amount of the first P pillar 121 may tend to be decreased from the upper end toward the lower end of the first P pillar 121, and the N-type charge amount of the first N pillar 122 may tend to be decreased from the upper end toward the lower end of the first N pillar 122. In addition, the trend of decreasing the P-type charge amount of the first P pillar 121 from the upper end to the lower end may be a more rapid change than the trend of decreasing the N-type charge amount of the first N pillar 122 from the upper end to the lower end.

Accordingly, the P-type charge amount may be greater than the N-type charge amount at the same height as the upper ends or heights adjacent to the upper ends of the first P pillar 121 and the first N pillar 122. In addition, the N-type charge amount may be greater than the P-type charge amount at the same height as the lower ends or heights adjacent to the lower ends of the first P pillar 121 and first N pillar 122.

In addition, the entire charge amount of the upper end of the upper pillar region 125a may be greater than the entire charge amount of the lower end of the upper pillar region 125a, and the P-type charge amount may be greater than the N-type charge amount in the upper pillar region 125a. In addition, the entire charge amount of the upper end of the lower pillar region 125c may be greater than the entire charge amount of the lower end of the lower pillar region 125c, and the N-type charge amount may be greater than the P-type charge amount in the lower pillar region 125c.

To sum up such a distribution, the middle pillar region 125b may include a charge amount balanced region in which the P-type charge amount and the N-type charge amount are balanced. That is, in the charge amount balanced region, the P-type charge amount that relatively steeply decreases toward the lower end from the upper end of the first P pillar 121 and the N-type charge amount that relatively smoothly decreases toward the lower end from the upper of the first N pillar 122 are balanced such that the P-type charge amount and the N-type charge amount can be balanced in the charge amount balanced region.

Due to such a distribution, the first P pillar 121 and the first N pillar 122 must include regions corresponding to a charge amount balanced region. That is, the charge amount balanced region can be clearly defined in the active region AR of the second semiconductor layer 120, and the middle pillar region 125b including the charge amount balanced region can also be clearly defined.

Accordingly, the upper pillar region 125a disposed in an upper portion with reference to the middle pillar region 125b and the lower pillar region 125c disposed in a lower portion with reference to the middle pillar region 125b can also be clearly defined. Here, the upper pillar region 125a may be referred to as a P-rich region because the P-type charge amount of the first P pillar 121 is dominant, and the lower pillar region 125c may be referred to as an N-rich region because the N-type charge amount of the first N pillar 122 is dominant.

Therefore, the boundary between the upper pillar region 125a and the middle pillar region 125b and the boundary between the middle pillar region 125b and the lower pillar region 125c are not set to a specific height or ratio, but may be changed depending on a design, an implementation method, a process environment, and the like according to a specific implementation purpose of a specific super-junction semiconductor device. However, since the middle pillar region 125b can be clearly determined in the product manufacturing process, it is clear that the boundary between the upper pillar region 125a and the middle pillar region 125b and the boundary between the middle pillar region 125b and the lower pillar region 125c can be inevitably clearly decided.

FIG. 3 to FIG. 8 are provided for description of charge amount distribution of the semiconductor device according to the exemplary embodiment of the present disclosure.

Figure 3:
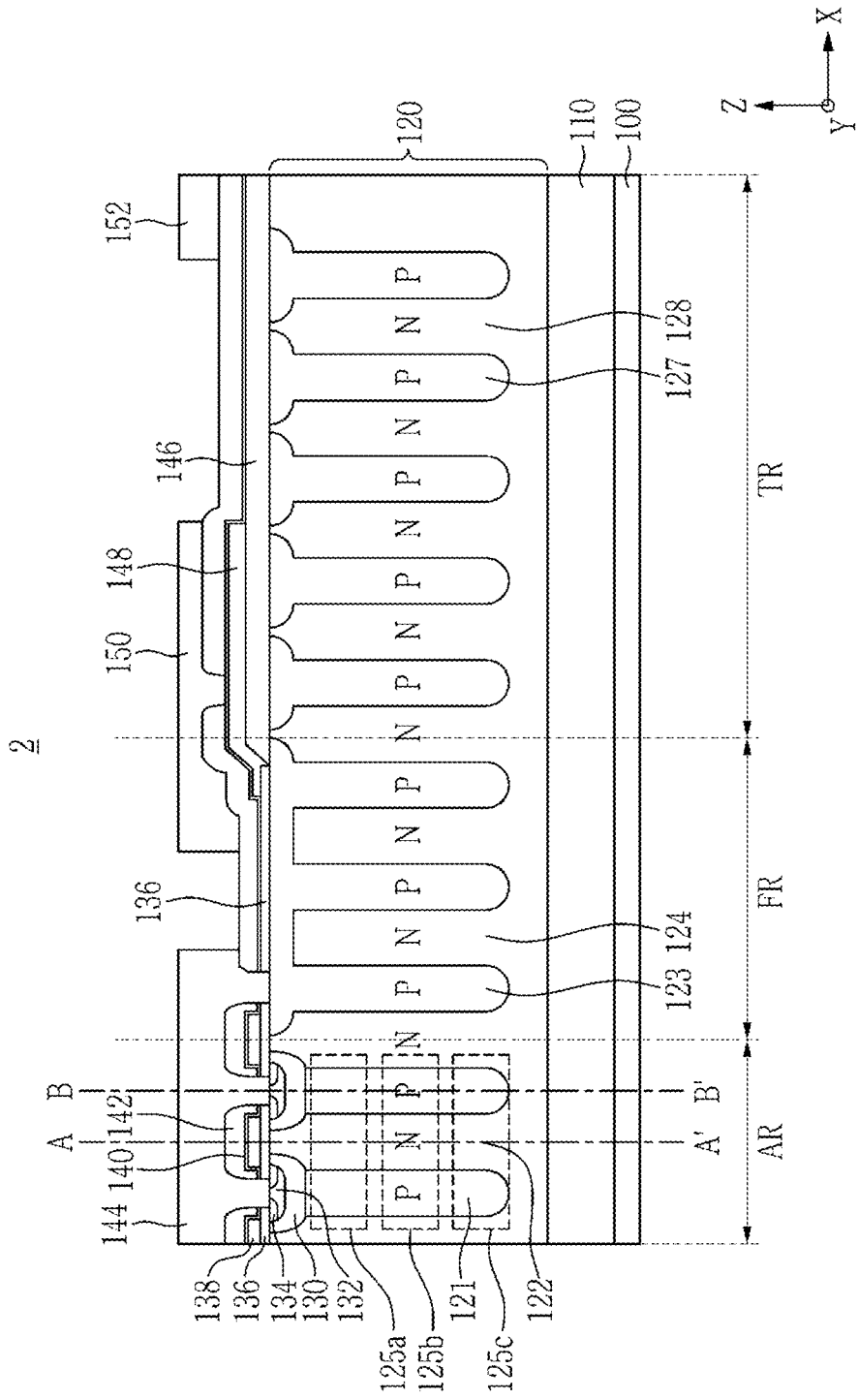
FIG. 3 to FIG. 8 are provided for description of charge amount distribution of the semiconductor device according to the exemplary embodiment of the present disclosure.

Referring to FIG. 3, graphs shown in FIG. 4 to FIG. 7 illustrate a charge amount that changes along the line A-A' and the line B-B' in the semiconductor device 2 according to the exemplary embodiment of the present disclosure.

The line A-A' is a line defined to pass the center of the first N-pillar 122 in the first direction X while following the first N-pillar 122 in the third direction Z in the active region AR, and the line B-B' is a line defined to pass the center of the first P-pillar 121 in the first direction X, while following the first P-pillar 121 in the third direction Z in the active region AR. In FIG. 4 to FIG. 7, the charge amount changing along the line A-A' is indicated as "NP", and the charge amount charging along the line B-B' is indicated as "PP".

Figure 4:
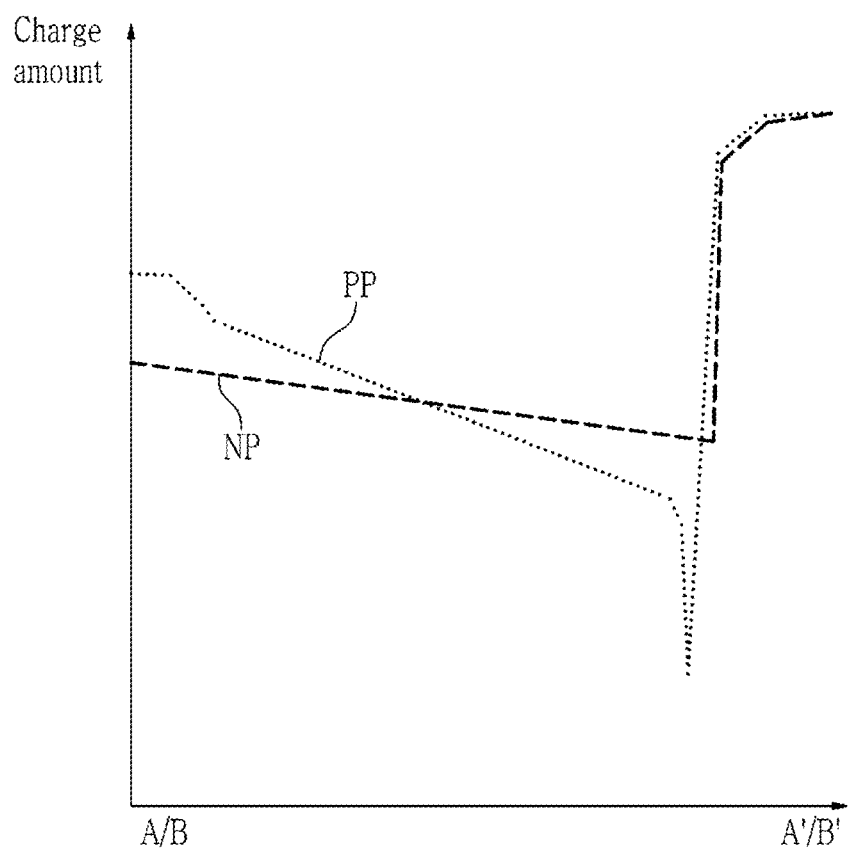

Referring to FIG. 4, the NP linearly decreases along the line A-A', and the PP also linearly decreases along the line B-B'. Specifically, the P-type charge amount and the N-type charge amount may linearly decrease from the upper end of the upper pillar region 125a to the lower end of the lower pillar region 125c in the active region AR.

In this case, the PP along the line B-B' may decrease with a first slope, and the NP along the line A-A' may decrease with a second slope that is lower than the first slope. That is, the P-type charge amount from the upper end of the upper pillar region 125a to the lower end of the lower pillar region 125c of the active region AR may decrease with the first slope, and the N-type charge amount may decrease with the second slope that is lower than the first slope.

Figure 5:
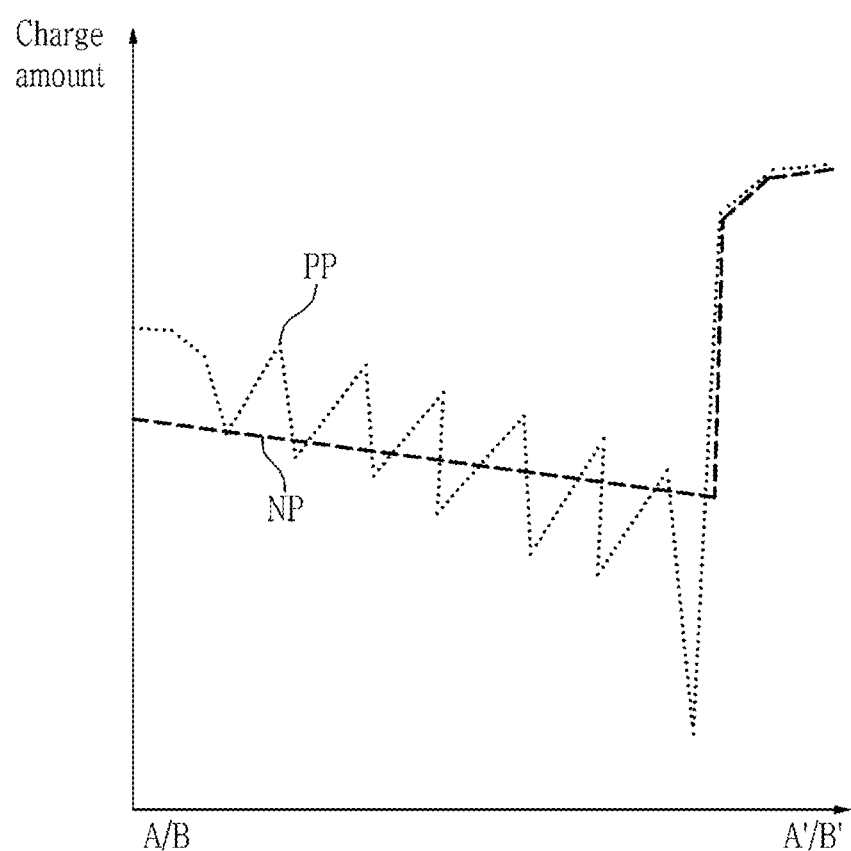

Referring to FIG. 5, the NP linearly decreases along the line A-A' and the PP decreases non-linearly along the line B-B'. Here, the non-linearity may mean a case with a ripple as illustrated. Specifically, from the upper end of the upper pillar region 125a of the active region AR to the lower end of the lower pillar region 125c, the P-type charge amount may decrease nonlinearly and the N-type charge amount may decrease linearly.

In this case, even though the PP along the line B-B' has a ripple, the overall trend decreases with the first slope, and the NP along the line A-A' may decrease with the second slope that is lower than the first slope. That is, the change in the P-type charge amount from the upper end of the upper pillar region 125a of the active region AR to the lower end of the lower pillar region 125c may have a decreasing trend overall with the first slope, and the N-type charge amount decreases with a second slope that is lower than the first slope.

Figure 6:
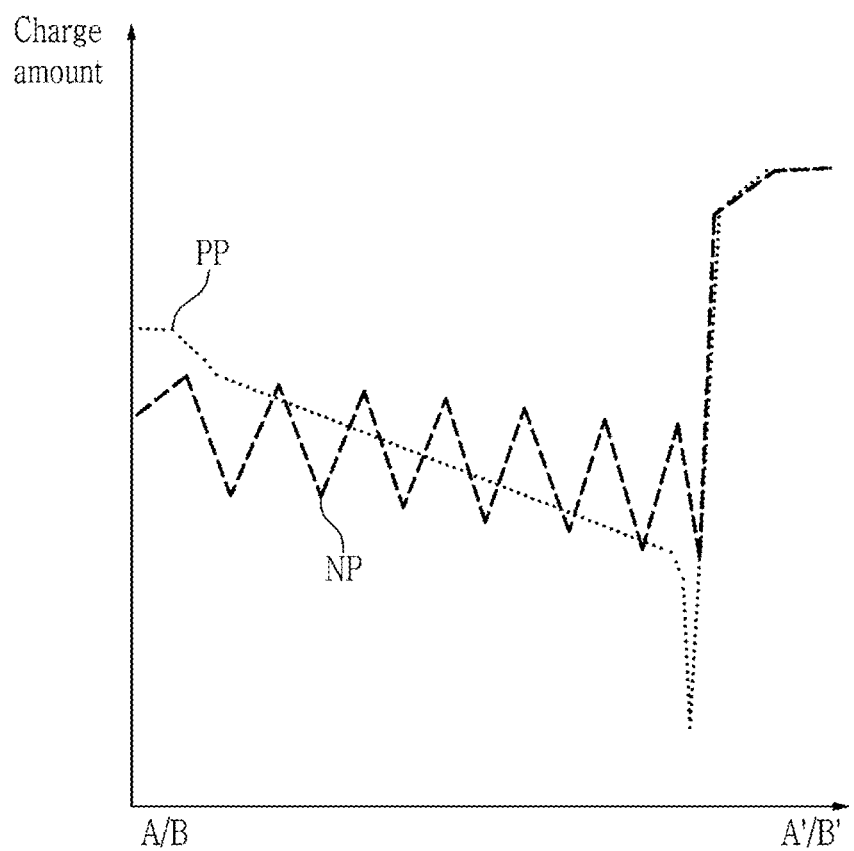

Referring to FIG. 6, NP non-linearly decreases along the line A-A', and PP linearly decreases along the line B-B'. Specifically, the P-type charge amount may linearly decrease and the N-type charge amount may non-linearly decrease from the upper end of the upper pillar region 125a of the active region AR.

In this case, PP along the line B-B' decreases with the first slope, and NP along the line A-A' has the ripple, but may decrease overall with a second slope that is lower than the first slope. That is, from the upper end of the upper pillar region 125a of the active region AR to the lower end of the lower pillar region 125c, the P-type charge amount may decrease with the first slope, and the change in the N-type charge amount has a decreasing trend with the second slope that is lower than the first slope as a whole.

Figure 7:
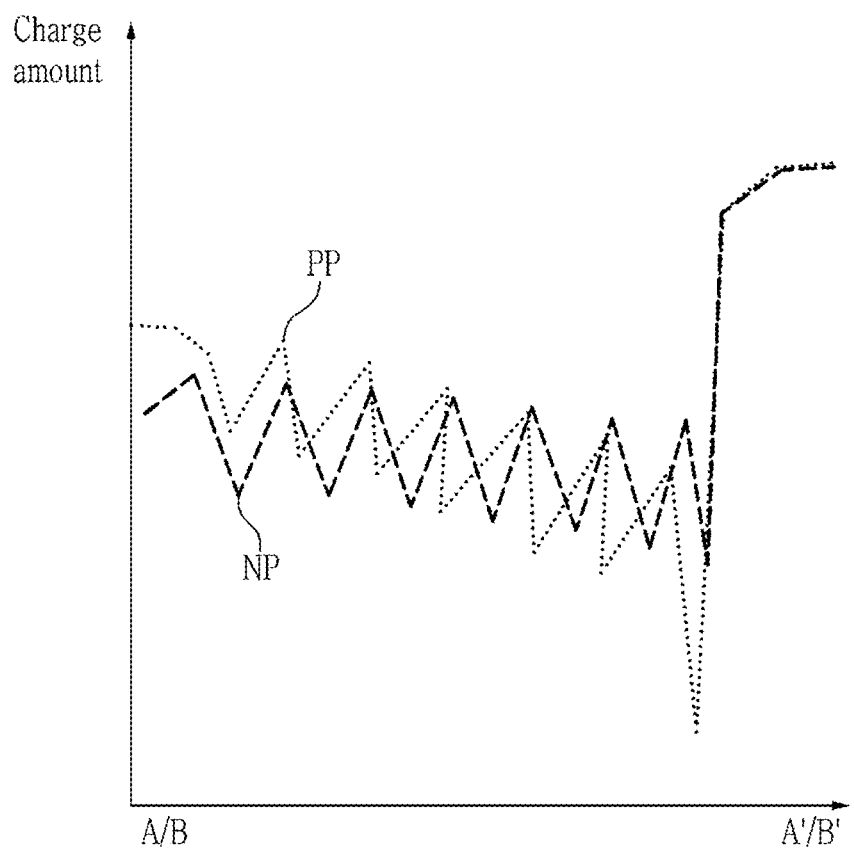

Referring to FIG. 7, NP non-linearly decreases along the line A-A' and PP also non-linearly decreases along the line B-B'. Specifically, the P-type charge amount and the N-type charge amount may non-linearly decrease from the upper end of the upper pillar region 125a of the active region AR to the lower end of the lower pillar region 125c.

In this case, the PP along the line B-B' may overall decrease with the first slope even though having the ripple, and the NP along the line A-A' may overall decrease with the second slope that is lower than the first slope. That is, the change in the P-type charge amount from the upper end of the upper pillar region 125a of the active region AR to the lower end of the lower pillar region 125c may have a decreasing trend overall with the first slope, and the change in the N-type charge amount may have a decreasing trend with the second slope that is lower than the first slope.

Figure 8:
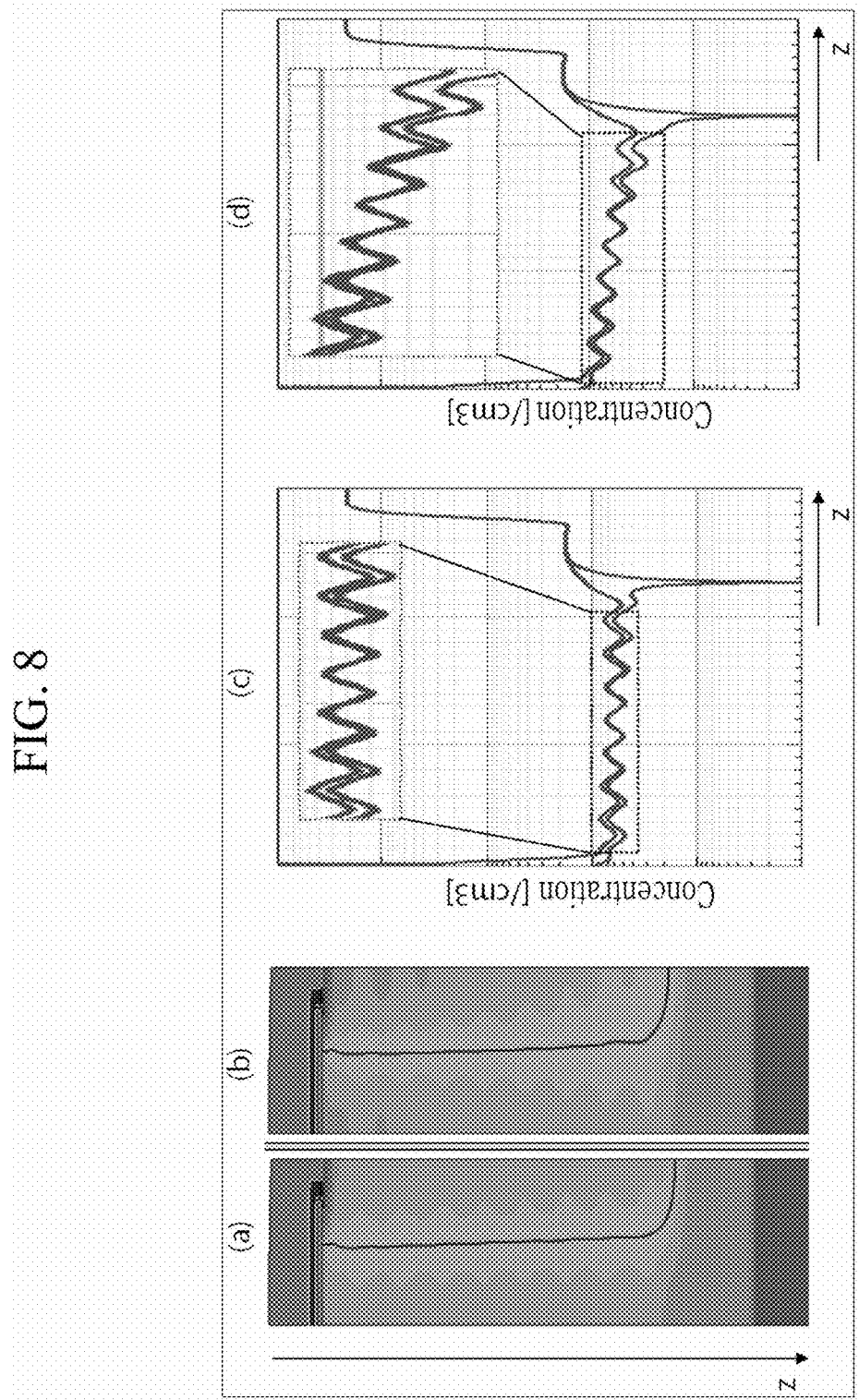

Referring to FIG. 8, simulation data of a pillar concentration profile is shown.

In FIG. 8, (a) and (c) relate to simulation in a reference super-junction structure, and (b) and (d) relate to simulation according to a super-junction structure of the present disclosure.

In the reference super-junction structure, a result showing the concentration of the pillar in the z direction as in (a) is shown in (c). In (c), the P-type charge amount is insignificantly higher than the N-type charge amount in the upper portion of the pillar and the P-type charge amount is insignificantly lower than the N-type charge amount in the lower portion of the pillar, but the overall trend of the P pillar concentration and the N pillar concentration appears constant along the z direction.

In the super-junction structure of the present disclosure, a result showing the concentration of the pillar in the z direction as in (b) is shown in (d). In (d), the P-type charge amount is greater than the N-type charge amount in the upper portion of the pillar and the P-type charge amount is lower than the N-type charge amount in the lower portion of the pillar, and the overall trend of the P pillar concentration and the N pillar concentration appears to decrease with the z direction. In addition, the change of the P-type charge amount has a decreasing trend of the first slope as a whole, and the change of the N-type charge amount has a decrease of the second slope that is lower than the first slope as a whole.

FIG. 9 to FIG. 13 are provided for description of advantageous effects of the semiconductor device according to the exemplary embodiments of the present disclosure.

Figure 9:
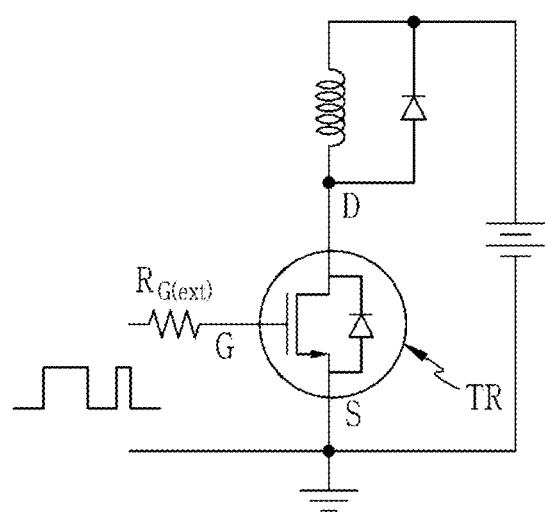
FIG. 9 to FIG. 13 are provided for description of advantageous effects of the semiconductor device according to the exemplary embodiments of the present disclosure.

Referring to FIG. 9, a representative application circuit 3 with respect to the semiconductor device according to the exemplary embodiments of the present disclosure is illustrated. In a super-junction semiconductor device TR, a gate G is insulated from a drain D and a source S by a gate insulation layer, and a PN junction is formed through a substrate between the drain D and the source S.

When a chip in which the super-junction semiconductor device TR is implemented is down-sized, a parasitic capacitance value may decrease. When the parasitic capacitance value is decreased, switching speed of the super-junction semiconductor device TR is increased, but, for example, in a turn-off operation, a problem of EMI, a problem of increasing overshoot of the drain voltage $V_{DS}$, and increasing oscillation or spiking of the gate voltage $V_{GS}$ occur as the steep dVDS/dt and dID/dt slopes is increased.

Thus, in the semiconductor device according to the exemplary embodiments of the present disclosure, an upper portion with reference to the center of the active region ACT pillar is P-rich and a lower portion is N-rich while the P-type charge amount and the N-type charge amount are balanced near the center of the active region ACT pillar in the vertical direction, and the charge amount is gradually increased in the upper portions of the P pillar and the N pillar in the vertical direction and the charge amount is gradually decreased in the lower portions of the P pillar and the N pillar such that, during a turn-off switching operation, increasing speed of a width of a depletion layer in the upper region of the N pillar according to an increase of a drain voltage is set to be slowed down, to thereby accelerate formation of a charge pocket and increase a parasitic capacitance value $C_{GD}$ due to the charge pocket. Here, the charge pocket may imply a neutral region that is isolated in a middle of a depletion region.

As already known, when the parasitic capacitance value $C_{GD}$ is increased, a drain voltage $V_{DS}$ is smoothly changed, that is, the $dV_{DS}/dt$ slope may be decreased. In the switching operation of the application circuit 3, $dV_{DS}/dt$ is inversely proportional to the parasitic capacitance value $C_{GD}$ during the turn-off operation.

$$\frac{dv_{DS}}{dt} = \frac{V_{GP}}{C_{GD}R_G}$$

Thus, the drain voltage $V_{DS}$ can be controlled not to be rapidly changed due to the effect of increasing the parasitic capacitance value $C_{GD}$ while down-sizing the chip, and accordingly, the EMI characteristic, overshoot of the drain voltage $V_{DS}$, and oscillation or spiking of the gate voltage $V_{GS}$ can be remarkably improved. In addition, the semiconductor device has a unique symmetry that increases the amount of charge in both the P pillar and the N pillar toward the top of the active area (ACT), and decreases the amount of charge in both the P pillar and the N pillar toward the bottom, and thus it is possible to minimize negative effects such as a decrease in $BV_{DSS}$ or a change in the resistance value $R_{DS(ON)}$ of an element device according to the charge amount imbalance. Accordingly, the semiconductor device according to the exemplary embodiments of the present disclosure can secure reliability and stability while realizing down-sizing of a chip.

Figure 10:
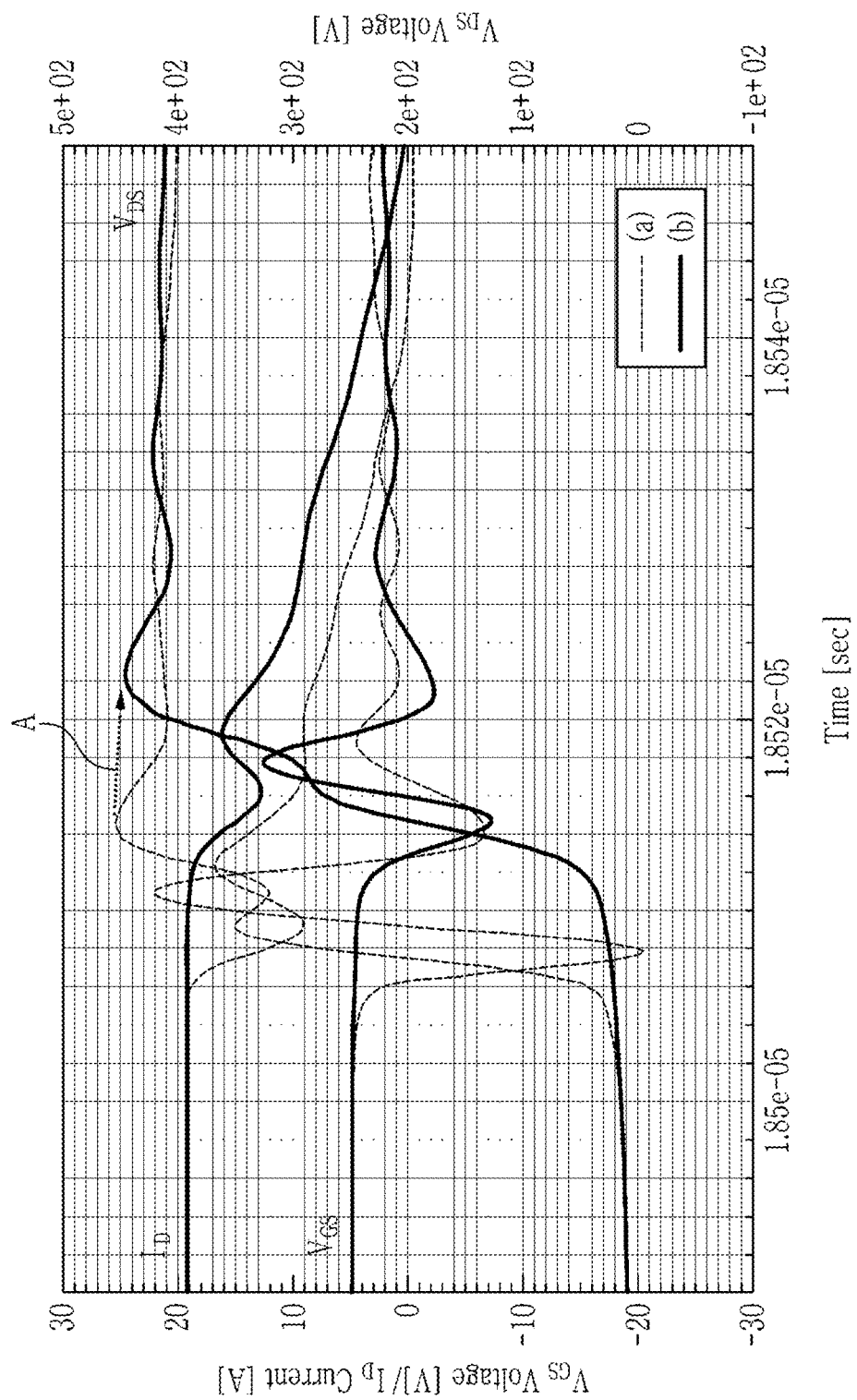
Figure 11:
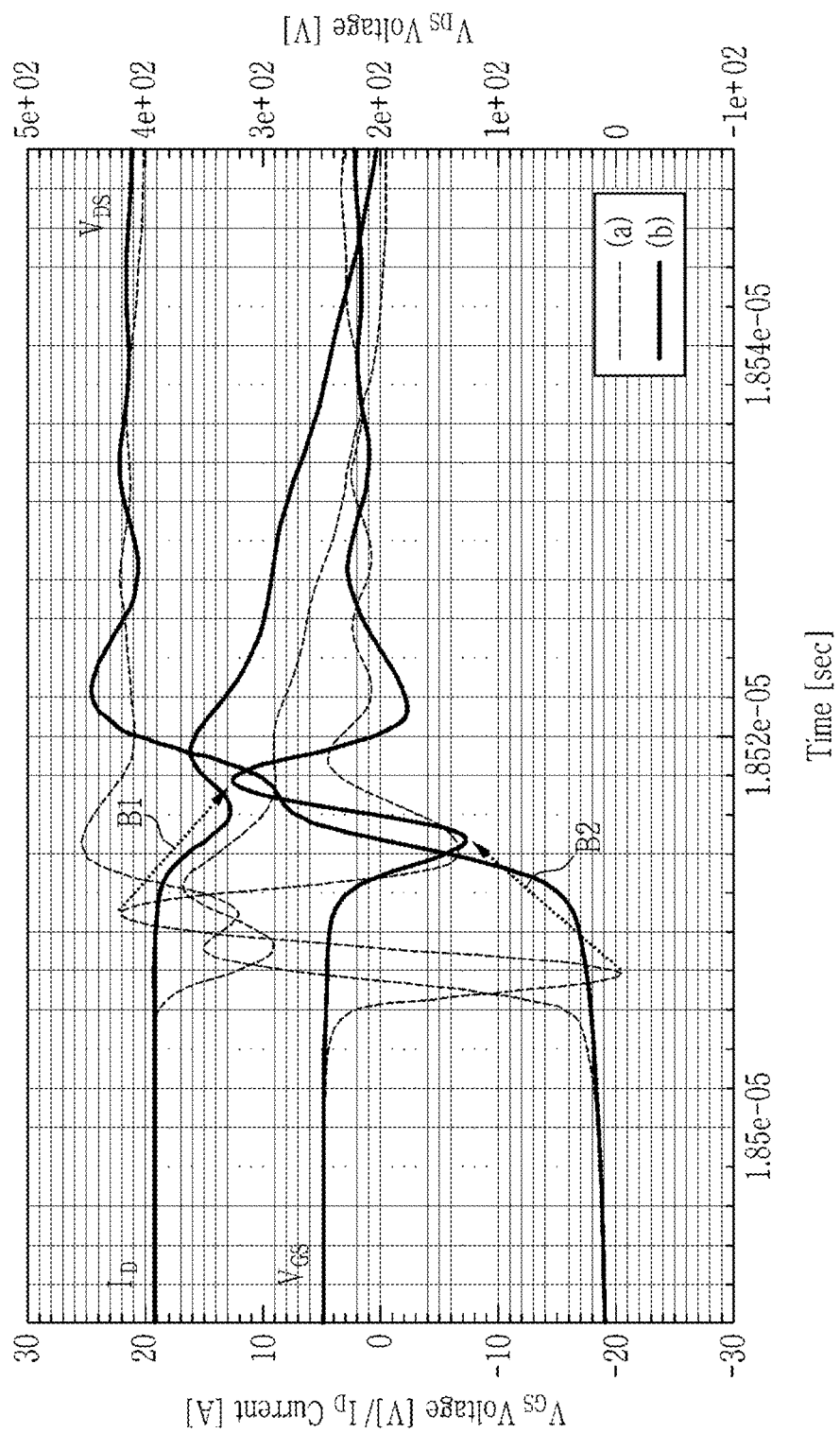
Figure 12:
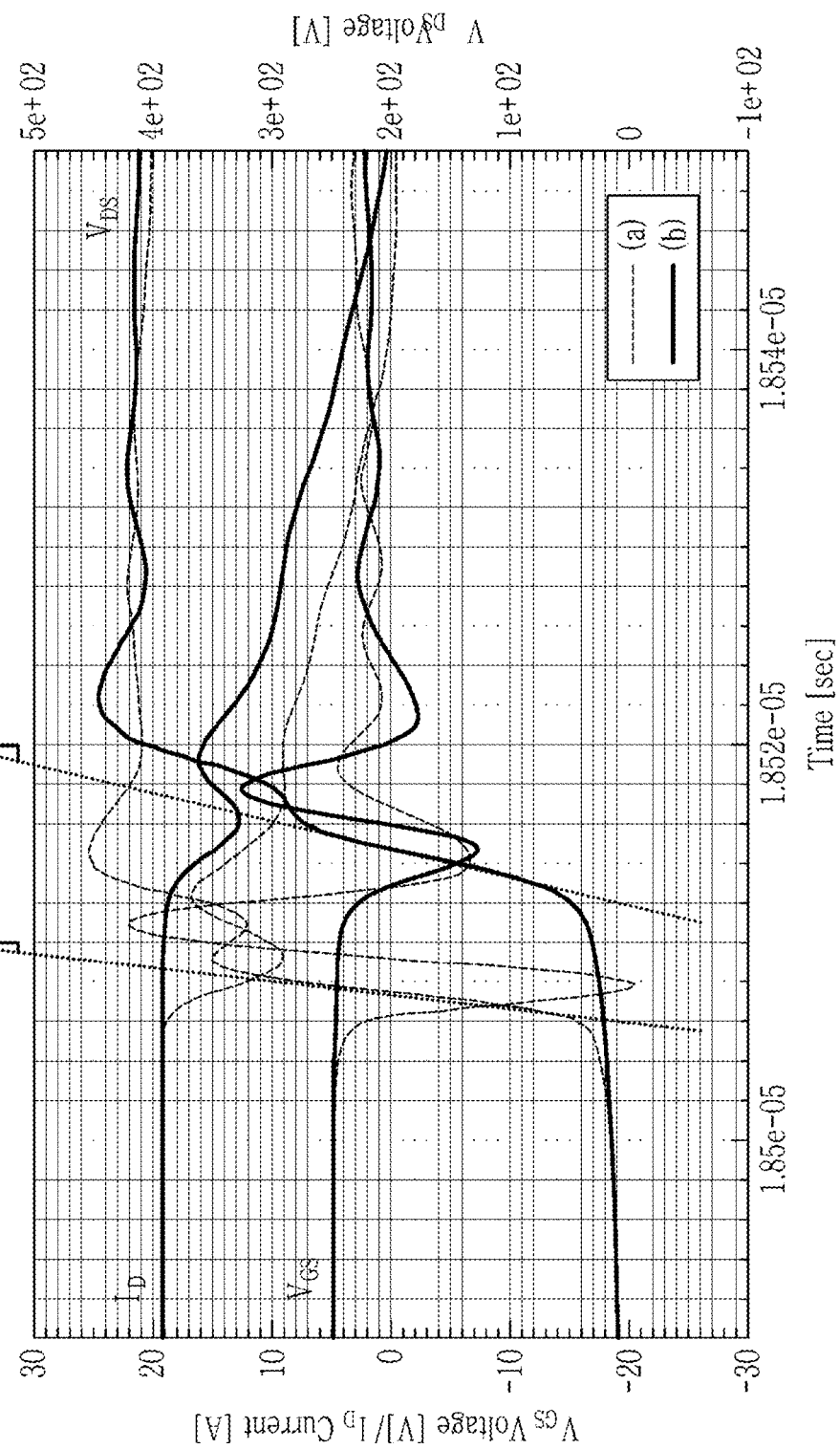

Referring to FIG. 10 to FIG. 12, simulation data that shows an effect of improving EMI problems, a problem of increasing overshoot of the drain voltage $V_{DS}$, and increasing oscillation or spiking of the gate voltage $V_{GS}$ that occur as the steep dVDS/dt and dID/dt slopes become more steep in the switching waveform is shown. In FIG. 10 to FIG. 12, the dotted line (a) shows reference data, and the solid line (b) shows data with respect to the semiconductor device according to the exemplary embodiments of the present disclosure.

Referring to FIG. 10, a simulation result with respect to the semiconductor device according to the exemplary embodiments of the present disclosure shows that the overshoot of the drain voltage $V_{DS}$ is decreased as marked by "A".

Subsequently, referring to FIG. 11, a simulation result with respect to the semiconductor device according to the exemplary embodiments of the present disclosure shows that the highest point of oscillation of the gate voltage $V_{GS}$ is decreased as marked by "B1" and the lowest point of the oscillation of the gate voltage $V_{GS}$ is increased as marked by "B2", and accordingly, the oscillation or spiking of the gate voltage $V_{GS}$ is decreased.

Referring to FIG. 12, a simulation result with respect to the semiconductor device according to the exemplary embodiments of the present disclosure shows that the slope of $dV_{DS}/dt$ is decreased as marked by "C".

Figure 13:
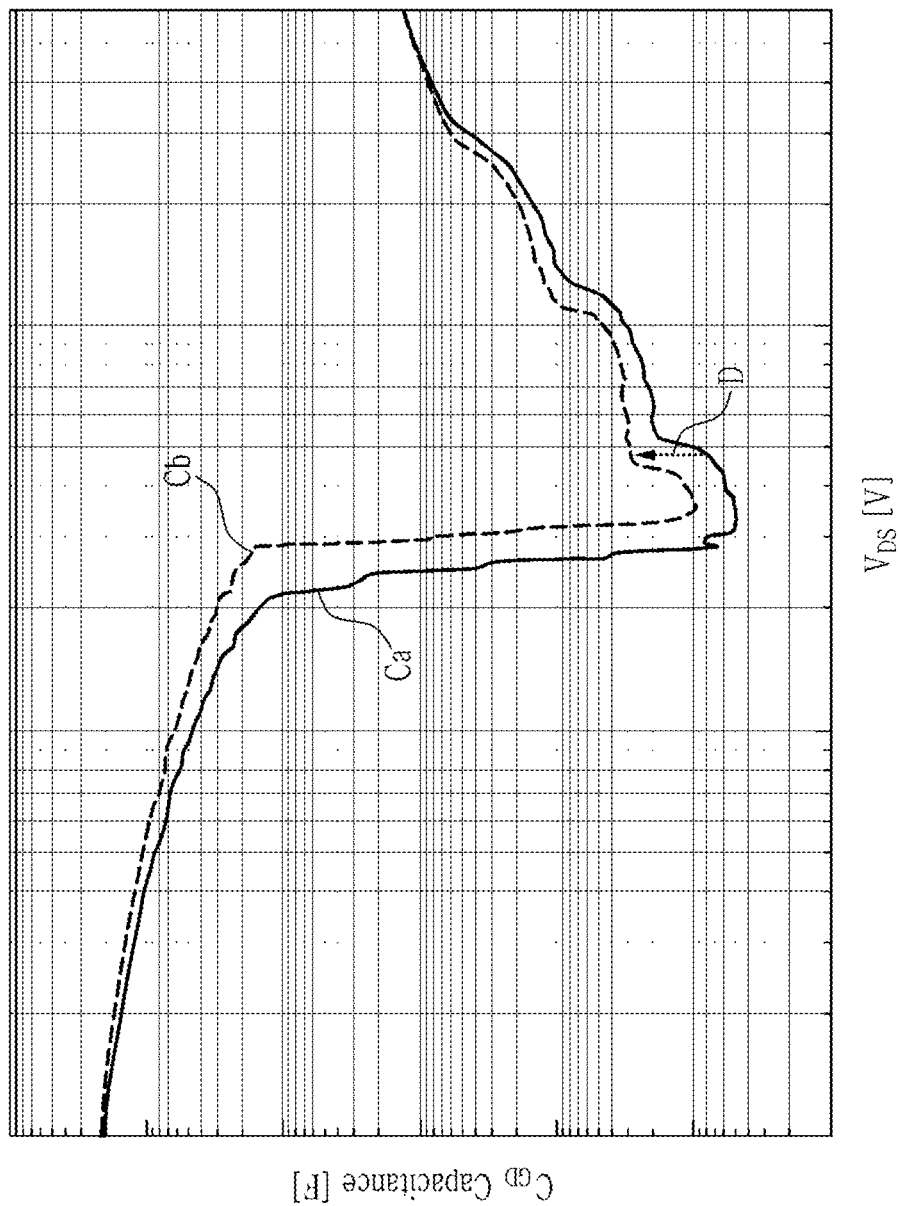

Meanwhile, referring to FIG. 13, a simulation result with respect to the semiconductor device according to the exemplary embodiments of the present disclosure shows the parasitic capacitance value $C_{GD}$ is increased as marked by "D". In FIG. 13, the solid line Ca indicates reference data, and the dotted line Cb indicates data of the semiconductor device according to the exemplary embodiments of the present disclosure.

Figure 14:
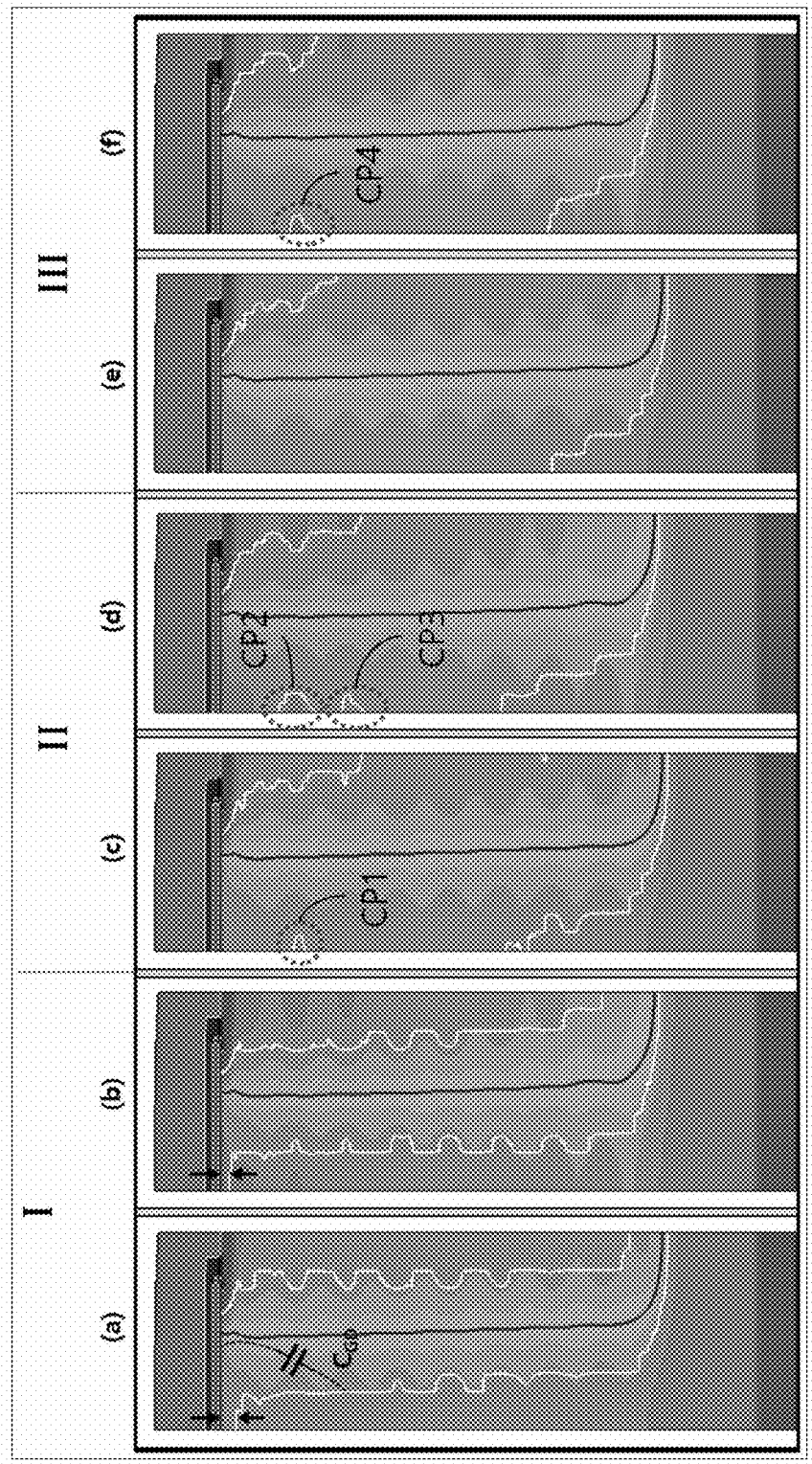
FIG. 14 is provided for description of a semiconductor device according to an exemplary embodiment of the present disclosure.

FIG. 14 is provided for description of a semiconductor device according to an exemplary embodiment of the present disclosure.

Referring to FIG. 14, in a semiconductor device according to an exemplary embodiment of the present disclosure, a charge pocket may be formed in a first N pillar 122 while a drain voltage applied through a drain electrode 100 and a source electrode 144 is increased.

In FIG. 14, I shows a simulation result when the drain voltage, that is, at the moment when the drain voltage starts to increase, II shows a simulation result while the drain voltage increases, and III shows a simulation result after the drain voltage increases to more than in II. In addition, (a), (c), and (e) show simulation results with respect to the reference, and (b), (d), and (f) show simulation results with respect to the semiconductor device according to the exemplary embodiments of the present disclosure.

Referring to I, a depletion layer indicated by a white boundary line is formed, and in (b) compared to (a), a width of the depletion layer is small and thus the parasitic capacitance $C_{GD}$ value increases.

Referring to II, charge pockets CP1, CP2, and CP3 are formed, and in (d) compared to (c), much more charge pockets CP2 and CP3 are formed and thus the parasitic capacitance $C_{GD}$ value increases due to the much more charge amount of pockets.

Referring to III, in case of (e), the drain voltage is more increased than in II such that the charge pockets disappear, but in case of (f), the amount of the charge pockets is increased, and thus even when the drain voltage increases to more than in II, a remaining charge pocket CP4 still exists, and accordingly, the effect of increasing the parasitic capacitance $C_{GD}$ value occurs.

The fundamental cause of the feature in which the width of the depletion layer is small in I and the feature in which the charge pockets are formed more in II and III is that the N-type charge amount in an upper region (e.g., the upper pillar region 125a) of the structure according to the exemplary embodiment of the present disclosure is large. Accordingly, depletion of an N region (e.g., first N pillar 122) is delayed and a depletion situation similar to that of the reference device is created after a higher voltage is applied. In the case of simply increasing the amount of the N-type charge to create such a situation, the problem of decreasing the breakdown voltage may occur due to the break in charge balance, but in the structure according to the exemplary embodiment of the present disclosure, the amount of P-type charge is also increased such that the above-described effect can be obtained while maintaining the charge balance state equal to that of the reference element.

Figure 15:
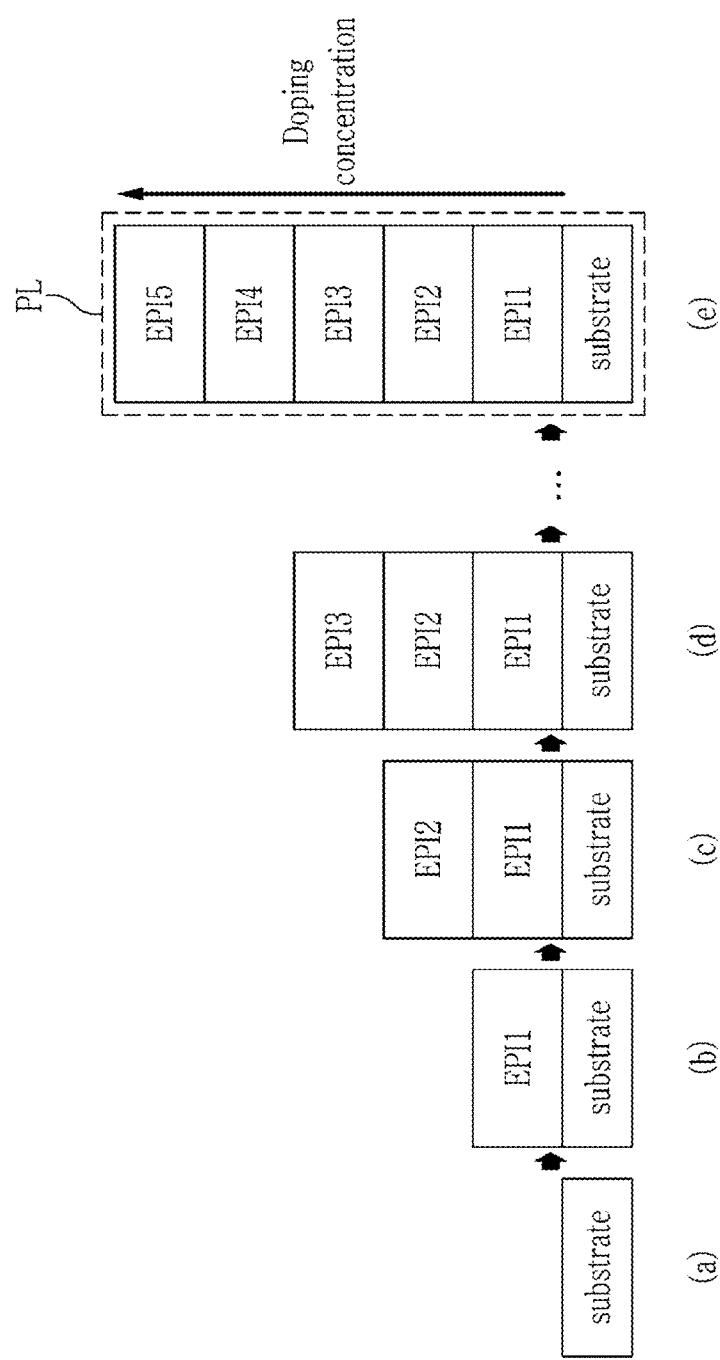
FIG. 15 is provided for description of a manufacturing method of a semiconductor device according to an exemplary embodiment of the present disclosure.

FIG. 15 is provided for description of a manufacturing method of a semiconductor device according to an exemplary embodiment of the present disclosure.

Referring to FIG. 15, a manufacturing method 4 of a semiconductor device according to an exemplary embodiment of the present disclosure may include the following steps for distributing a charge amount to be gradually increased toward the top and to be gradually decreased toward the bottom in a vertical direction in a P pillar and an N pillar.

In (a), a substrate may be provided. Here, the substrate may have N-type conductivity. For example, the substrate may be a part of a semiconductor substrate that is highly doped with an N-type impurity.

As shown in (b), a first epitaxial layer EPI1 may be formed on the substrate. That is, the first epitaxial layer EPI1 may be grown on the substrate. Here, the first epitaxial layer EPI1 may have a first doping concentration.

As shown in (c) to (e), a second epitaxial layer EPI2 to a fifth epitaxial layer EPI5 may be sequentially formed on the first epitaxial layer EPI1. That is, the second epitaxial layer EPI2 to the fifth epitaxial layer EPI5 may be sequentially grown on the first epitaxial layer EPI1. Here, the second epitaxial layer EPI2 to the fifth epitaxial layer EPI5 may each have a second doping concentration to a fifth doping concentration.

In a pillar PL of (e), the manufacturing process may be carried out to set the first doping concentration of the first epitaxial layer EPI1 to be the lowest, the fifth doping concentration of the fifth epitaxial layer EPI5 to be the highest, and the second doping concentration of the second epitaxial layer EPI2 to the fourth doping concentration of the fourth epitaxial layer EPI4 to be sequentially increased.

The pillar PL of (e) may be an N pillar or a P pillar. That is, the N pillar can be formed by performing the steps (a) to (e) by doping an N-type impurity, and the P pillar may be formed by performing the steps (a) to (e) by doping a P-type impurity.

Figure 16:
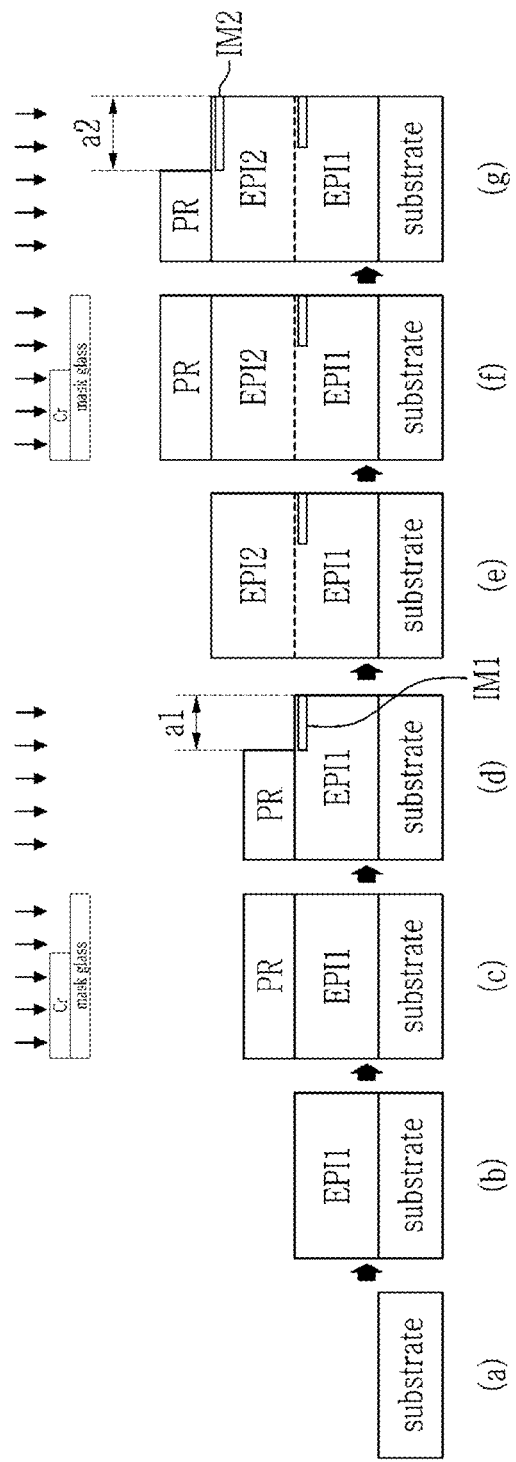
FIG. 16 to FIG. 17 are provided for description of a manufacturing method of a semiconductor device according to an exemplary embodiment of the present disclosure.
Figure 17:
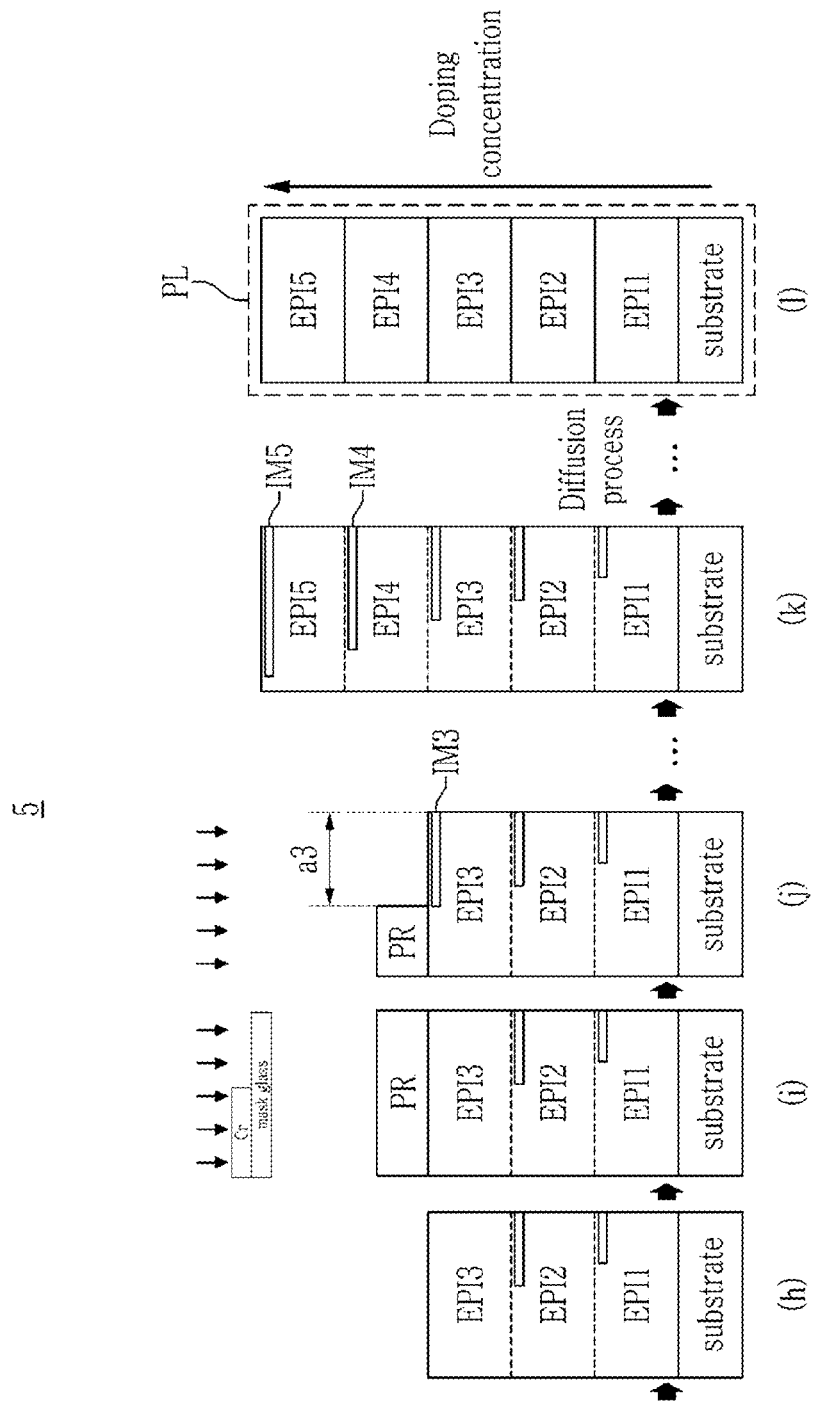

FIG. 16 to FIG. 17 are provided for description of a manufacturing method of a semiconductor device according to an exemplary embodiment of the present disclosure.

Referring to FIG. 16, a manufacturing method 5 of a semiconductor device according to an exemplary embodiment of the present disclosure may include the following steps for distributing a charge amount to be gradually increased toward the top and to be gradually decreased toward the bottom in a vertical direction in a P pillar and an N pillar.

In (a), a substrate may be provided. Here, the substrate may have N-type conductivity. For example, the substrate may be a part of a semiconductor substrate that is highly doped with an N-type impurity.

As shown in (b), a first epitaxial layer EPI1 may be formed on the substrate. That is, the first epitaxial layer EPI1 may be grown on the substrate. Here, the first epitaxial layer EPI1 may have a first doping concentration.

As shown in (c) to (d), a photoresist PR is formed on the first epitaxial layer EPI1, and then patterning may be carried out such that an open region has an area of aI. Next, a first ion injection layer IM1 may be formed by performing an ion injection process for injecting an impurity with respect to the corresponding open region. Here, the first ion injection layer IM1 may have a first dose.

As shown in (e), a second epitaxial layer EPI2 may be formed on the first epitaxial layer EPI1 where the first ion injection layer IM1 is positioned. That is, the second epitaxial layer EPI2 may be grown on the first epitaxial layer EPI1. Here, the second epitaxial layer EPI1 may have a second doping concentration that is substantially the same as the first doping concentration. In the present specification, the phrase "substantially the same" may mean that two values are the same or two values are both included in an allowable range or an error range that can be reasonably considered in the semiconductor manufacturing process. As shown in (f) to (g), after forming a photoresist PR on the second epitaxial layer EPI2, patterning may be performed so that the open region has an area of a2. Here, a2 may be greater than a1. Next, a second ion injection layer IM2 may be formed by performing an ion injection process for injecting an impurity with respect to the corresponding open region. Here, the second ion injection layer IM2 may have a second dose that is substantially the same as the first dose.

Subsequently, referring to FIG. 17, a third epitaxial layer EPI3 to a fifth epitaxial layer EPI5 may be formed on the second epitaxial layer EPI2 where the second ion injection layer IM2 is formed as shown in (h) to (k) of FIG. 16, and the third epitaxial layer EPI3 to the fifth epitaxial layer EPI5 may have a third doping concentration to a fifth doping concentration that are substantially the same as the first doping concentration.

In addition, the ion injection process is performed as previously described with reference to the third epitaxial layer EPI3 to the fifth epitaxial layer EPI5 such that a third ion injection layer IM3 to a fifth ion injection layer IM5 may be formed. Here, the third ion injection layer IM3 to the fifth ion injection layer IM5 may have a third dose to a fifth dose that are substantially the same as the first dose.

In addition, the manufacturing process may be carried out to set the area of the first ion injection layer IM1 to be the smallest, the area of the fifth ion injection layer IM5 to be the largest, and the areas of the second ion injection layer IM2 to the fourth ion injection layer IM4 to increase sequentially between the area of the IM5 and the fifth ion injection layer the area of the first ion injection layer IM1.

As shown in (I), after completion of forming of the ion injection layer, a diffusion process is performed to form a pillar PL. The pillar PL may be an N pillar or a P pillar. That is, the N pillar may be formed by performing the steps (a) to (l) by using an N-type impurity, and the P pillar may be formed by performing the steps (a) to (l) by using a P-type impurity.

Figure 18:
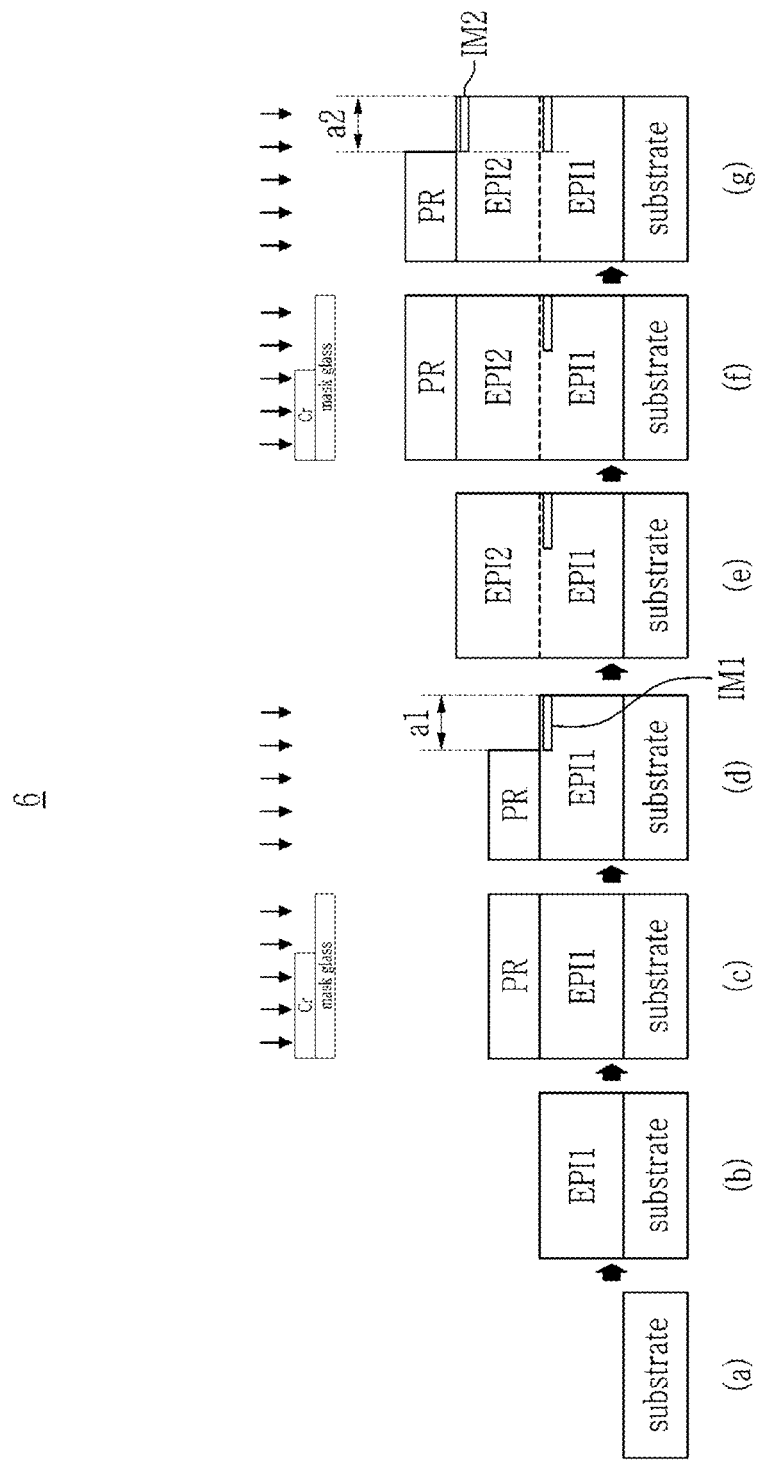
FIG. 18 to FIG. 19 are provided for description of a manufacturing method of a semiconductor device according to an exemplary embodiment of the present disclosure.
Figure 19:
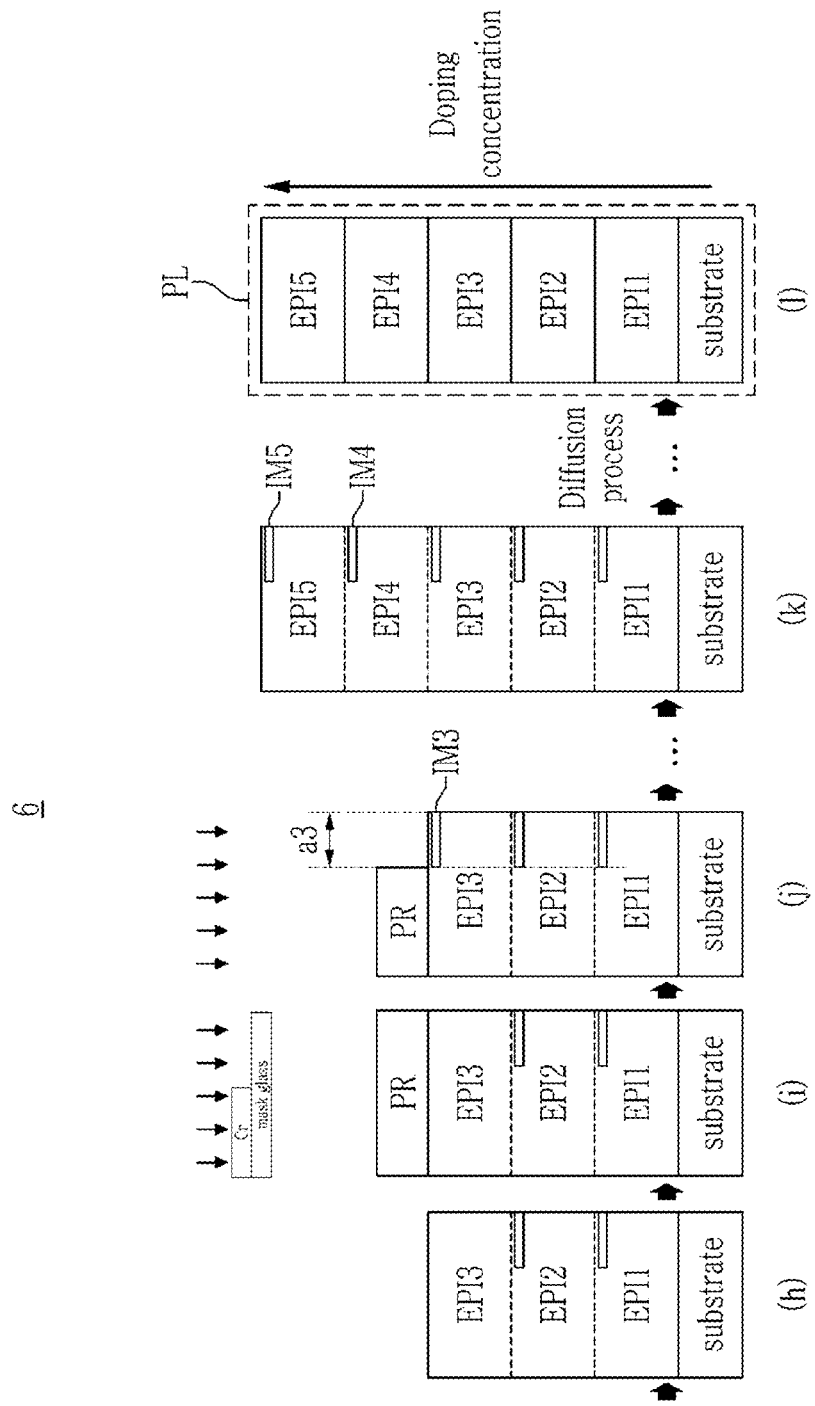

FIG. 18 to FIG. 19 are provided for description of a manufacturing method of a semiconductor device according to an exemplary embodiment of the present disclosure.

Referring to FIG. 18, a manufacturing method 6 of a semiconductor device according to an exemplary embodiment of the present disclosure may include the following steps for distributing a charge amount to be gradually increased toward the top and to be gradually decreased toward the bottom in a vertical direction in a P pillar and an N pillar.

In (a), a substrate may be provided. Here, the substrate may have N-type conductivity. For example, the substrate may be a part of a semiconductor substrate that is highly doped with an N-type impurity.

As shown in (b), a first epitaxial layer EPI1 may be formed on the substrate. That is, the first epitaxial layer EPI1 may be grown on the substrate. Here, the first epitaxial layer EPI1 may have a first doping concentration.

As shown in (c) to (d), a photoresist PR is formed on the first epitaxial layer EPI1, and then patterning may be carried out such that an open region has an area of a1. Next, a first ion injection layer IM1 may be formed by performing an ion injection process for injecting an impurity with respect to the corresponding open region. Here, the first ion injection layer IM1 may have a first dose.

As shown in (e), a second epitaxial layer EPI2 may be formed on the first epitaxial layer EPI1 where the first ion injection layer IM1 is positioned. That is, the second epitaxial layer EPI2 may be grown on the first epitaxial layer EPI1. Here, the second epitaxial layer EPI1 may have a second doping concentration that is substantially the same as the first doping concentration.

As shown in (f) to (g), after forming a photoresist PR on the second epitaxial layer EPI2, patterning may be performed so that the open region has an area of a2. Here, a2 may be substantially the same as a1. Next, a second ion injection layer IM2 may be formed by performing an ion injection process for injecting an impurity with respect to the corresponding open region. Here, the second ion injection layer IM2 may have a second dose that is greater than the first dose.

Subsequently, referring to FIG. 19, a third epitaxial layer EPI3 to a fifth epitaxial layer EPI5 may be formed on the second epitaxial layer EPI2 where the second ion injection layer IM2 is formed as shown in (h) to (k) of FIG. 18, and the third epitaxial layer EPI3 to the fifth epitaxial layer EPI5 may have a third doping concentration to a fifth doping concentration that are substantially the same as the first doping concentration.

In addition, the ion injection process is performed as previously described with reference to the third epitaxial layer EPI3 to the fifth epitaxial layer EPI5 such that a third ion injection layer IM3 to a fifth ion injection layer IM5 may be formed. Here, the third ion injection layer IM3 to the fifth ion injection layer IM5 may have a third dose to a fifth dose that are substantially the same as the first dose.

In addition, the manufacturing process may be carried out to set the first dose of the first ion injection layer IM1 to be the smallest, the fifth dose of the fifth ion injection layer IM5 to be the largest, and the second dose of the second ion injection layer IM2 to the fourth dose of the fourth ion injection layer IM4 to sequentially increase between the first dose of the first ion injection layer IM1 and the fifth dose of the fifth ion injection layer IM5.

As shown in (I), after completion of forming of the ion injection layer, a diffusion process is performed to form a pillar PL. Here, the pillar PL may be an N pillar or a P pillar. That is, the N pillar may be formed by performing the steps (a) to (l) by using an N-type impurity, and the P pillar may be formed by performing the steps (a) to (l) by using a P-type impurity.

Figure 20:
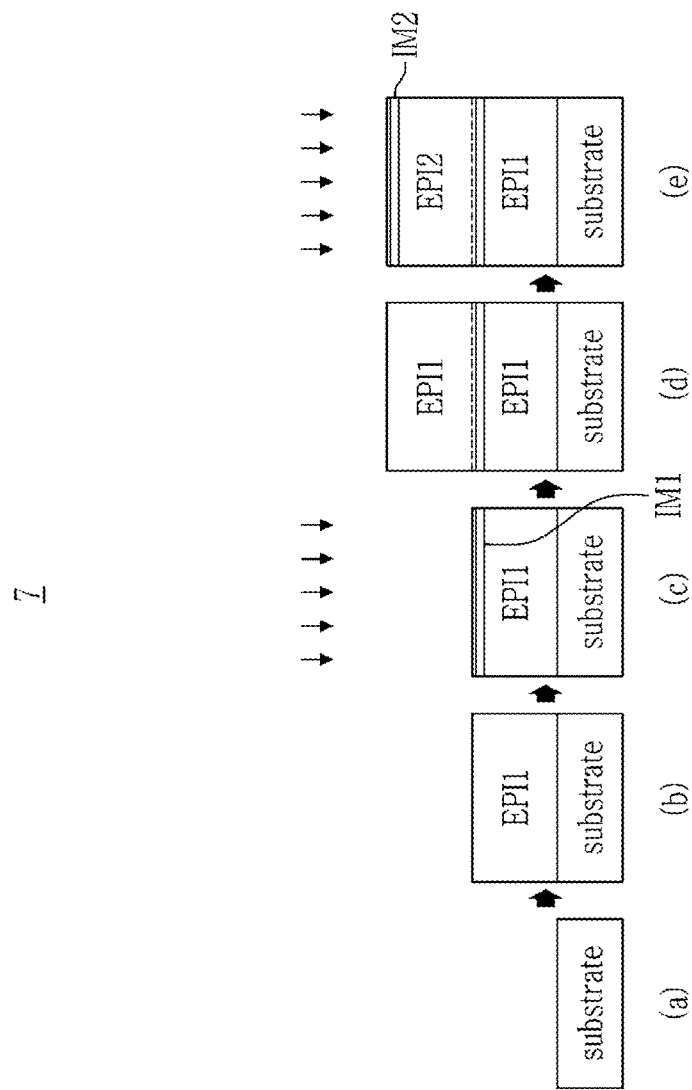
FIG. 20 to FIG. 21 are provided for description of a manufacturing method of a semiconductor device according to an exemplary embodiment of the present disclosure.
Figure 21:
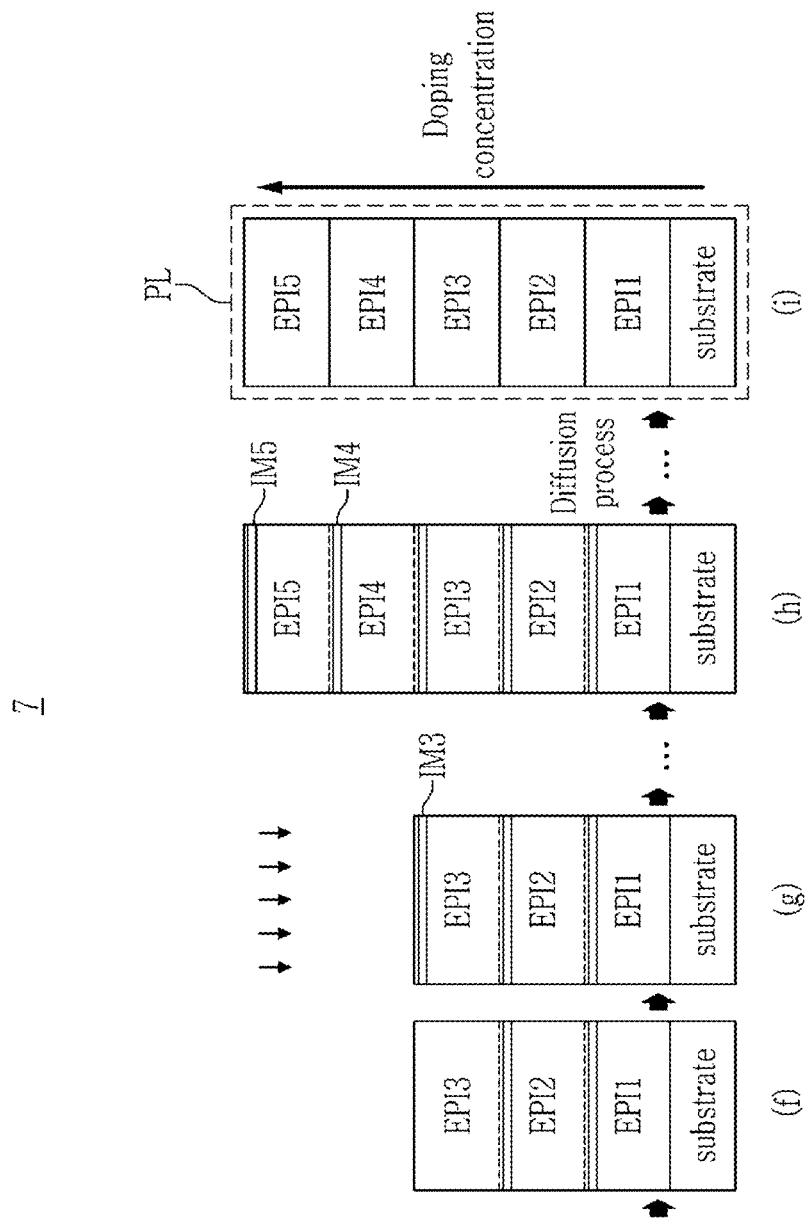

FIG. 20 to FIG. 21 are provided for description of a manufacturing method of a semiconductor device according to an exemplary embodiment of the present disclosure.

Referring to FIG. 20, a manufacturing method 6 of a semiconductor device according to an exemplary embodiment of the present disclosure may include the following steps for distributing a charge amount to be gradually increased toward the top and to be gradually decreased toward the bottom in a vertical direction in a P pillar and an N pillar.

In (a), a substrate may be provided. Here, the substrate may have N-type conductivity. For example, the substrate may be a part of a semiconductor substrate that is highly doped with an N-type impurity.

As shown in (b), a first epitaxial layer EPI1 may be formed on the substrate. That is, the first epitaxial layer EPI1 may be grown on the substrate. Here, the first epitaxial layer EPI1 may have a first doping concentration.

As shown in (c), a first ion injection layer IM1 may be formed by performing an ion injection process for injecting an impurity with respect to the first epitaxial layer EPI1. Here, the first ion injection layer IM1 may have a first dose.

As shown in (d), a second epitaxial layer EPI2 may be formed on the first epitaxial layer EPI1 where the first ion injection layer IM1 is positioned. That is, the second epitaxial layer EPI2 may be grown on the first epitaxial layer EPI1. Here, the second epitaxial layer EPI1 may have a second doping concentration that is substantially the same as the first doping concentration.

As shown in (e), a second ion injection layer IM2 may be formed by performing an ion injection process for injecting an impurity with respect to the second epitaxial layer EPI1. Here, the second ion injection layer IM2 may have a second dose that is greater than the first dose.

Subsequently, referring to FIG. 21, a third epitaxial layer EPI3 to a fifth epitaxial layer EPI5 may be formed on the second epitaxial layer EPI2 where the second ion injection layer IM2 is formed as shown in (h) to (k) of FIG. 20, and the third epitaxial layer EPI3 to the fifth epitaxial layer EPI5 may have a third doping concentration to a fifth doping concentration that are substantially the same as the first doping concentration.

In addition, the ion injection process is performed as previously described with reference to the third epitaxial layer EPI3 to the fifth epitaxial layer EPI5 such that a third ion injection layer IM3 to a fifth ion injection layer IM5 may be formed.

In addition, the manufacturing process may be carried out to set the first dose of the first ion injection layer IM1 to be the smallest, the fifth dose of the fifth ion injection layer IM5 to be the largest, and the second dose of the second ion injection layer IM2 to the fourth dose of the fourth ion injection layer IM4 to sequentially increase between the first dose of the first ion injection layer IM1 and the fifth dose of the fifth ion injection layer IM5.

As shown in (i), after completion of forming of the ion injection layer, a diffusion process is performed to form a pillar PL. Here, the pillar PL may be an N pillar or a P pillar. That is, the N pillar may be formed by performing the steps (a) to (l) by using an N-type impurity, and the P pillar may be formed by performing the steps (a) to (l) by using a P-type impurity.

FIG. 22 to FIG. 25 are provided for description of a manufacturing method of a semiconductor device according to an exemplary embodiment of the present disclosure. In particular, FIG. 22 to FIG. 25 are provided for description of an exemplary manufacturing method that forms both a P pillar and an N pillar by using the manufacturing method 6 of the semiconductor device of FIG. 18 to FIG. 19.

Figure 22:
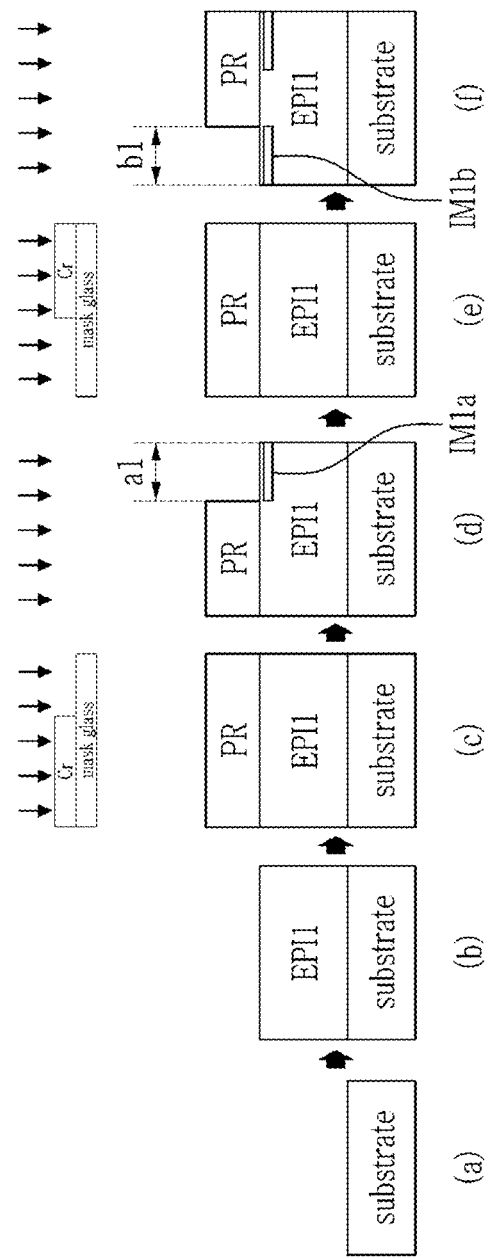
FIG. 22 to FIG. 25 are provided for description of a manufacturing method of a semiconductor device according to an exemplary embodiment of the present disclosure.

Referring to FIG. 22, a manufacturing method 8 of a semiconductor device according to an exemplary embodiment of the present disclosure may include the following steps for distributing a charge amount to be gradually increased toward the top and to be gradually decreased toward the bottom in a vertical direction in a P pillar and an N pillar.

Steps (a) to (d) may refer to the steps (a) to (d) of FIG. 18, and therefore, duplicated description will be omitted. As a result of the step (d), a first P-type ion injection layer IM1*a* may be formed in a first epitaxial layer EPI1, and the first P-type ion injection layer IM1*a* may have a first P-type dose.

As shown in (e), a photoresist PR is formed again on the first epitaxial layer EPI1 where the first P-type ion injection layer IM1*a* is formed, and then patterning may be carried out such that an open region has an area of b1. Next, a first N-type ion injection layer IM1*b* may be formed by performing an ion injection process for injecting an N-type impurity with respect to the open region. Here, the first N-type ion injection layer IM1*b* may have a first N-type dose.

Figure 23:
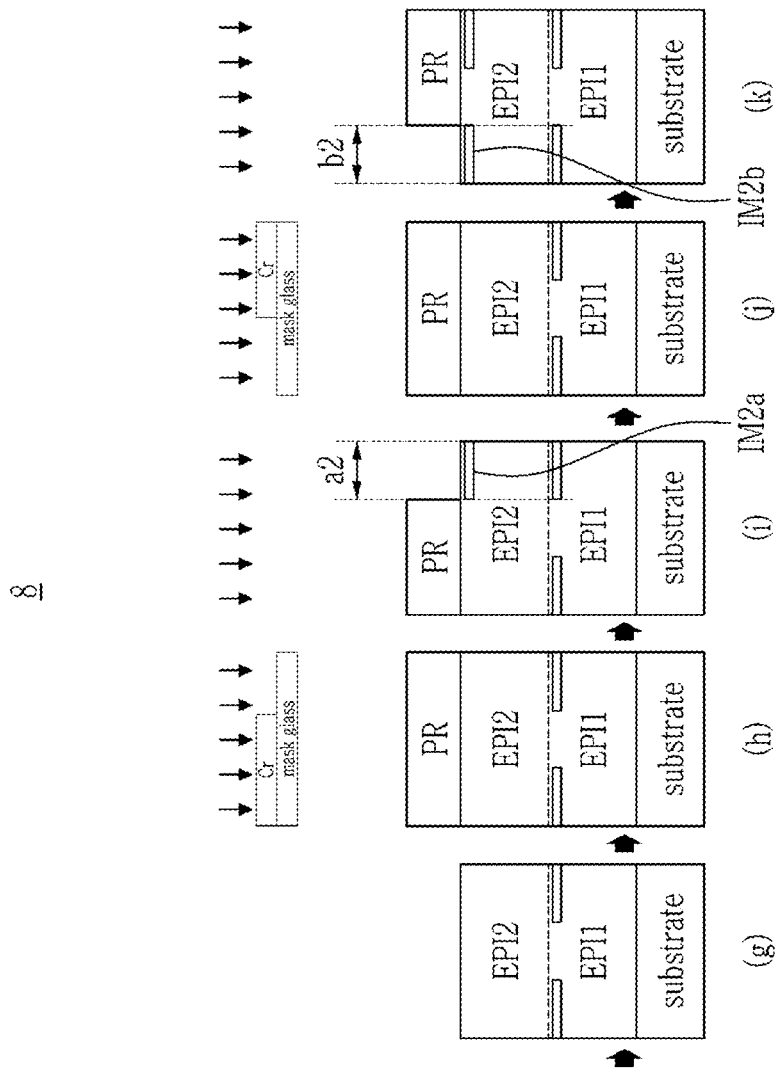

Subsequently, referring to FIG. 23, an ion injection process is performed on an open region having an area of a2 that is substantially the same as a1 to form a second P-type ion injection layer IM2*a* using the same method as in FIG. 22, and the second P-type ion injection layer IM2*a* may have a second P-type dose that is greater than the first P-type dose. In addition, an ion injection process is performed on an open region having an area of b2 that is substantially the same as b1 to form a second P-type ion injection layer IM2*b*, and the second P-type ion injection layer IM2*b* may have a second N-type dose that is greater than the first N-type dose.

Figure 24:
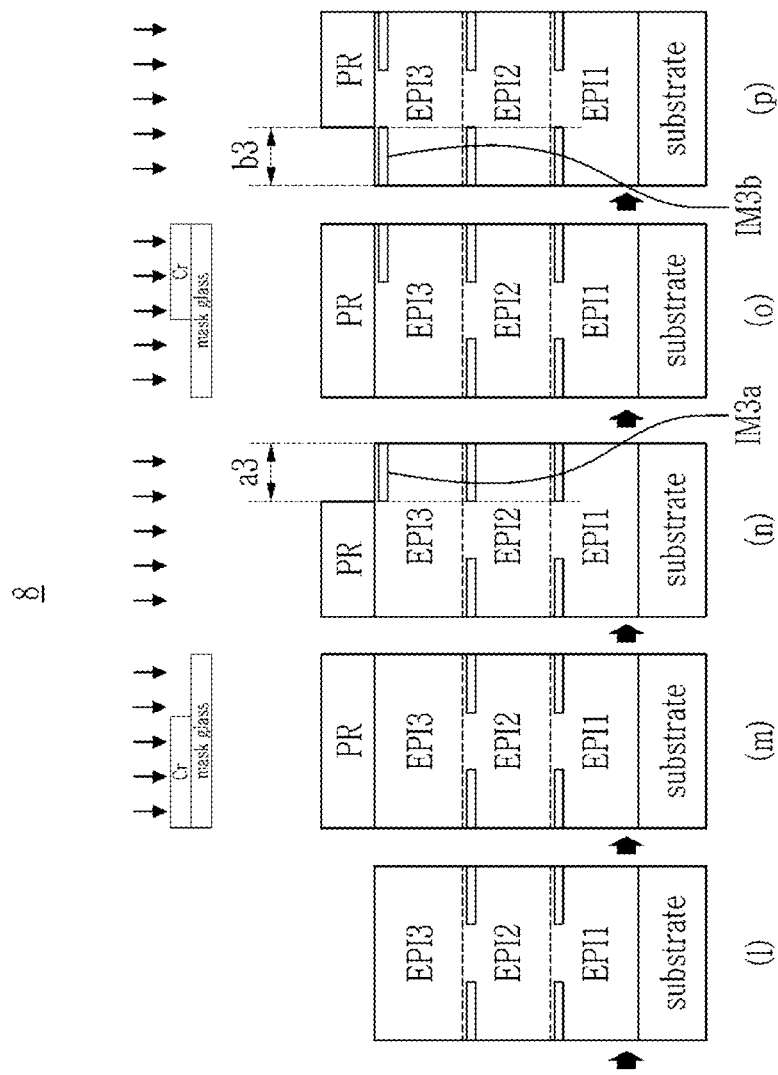

Subsequently, referring to FIG. 24, an ion injection process is performed on an open region having an area of a3 that is substantially the same as a1 to form a third P-type ion injection layer IM3*a* using the same method as in FIG. 23, and the third P-type ion injection layer IM3*a* may have a third P-type dose that is greater than the second P-type dose. In addition, an ion injection process is performed on an open region having an area of b3 that is substantially the same as b1 to form a third N-type ion injection layer IM3*b*, and the third N-type ion injection layer IM3b may have a third N-type dose that is greater than the second N-type dose.

Figure 25:
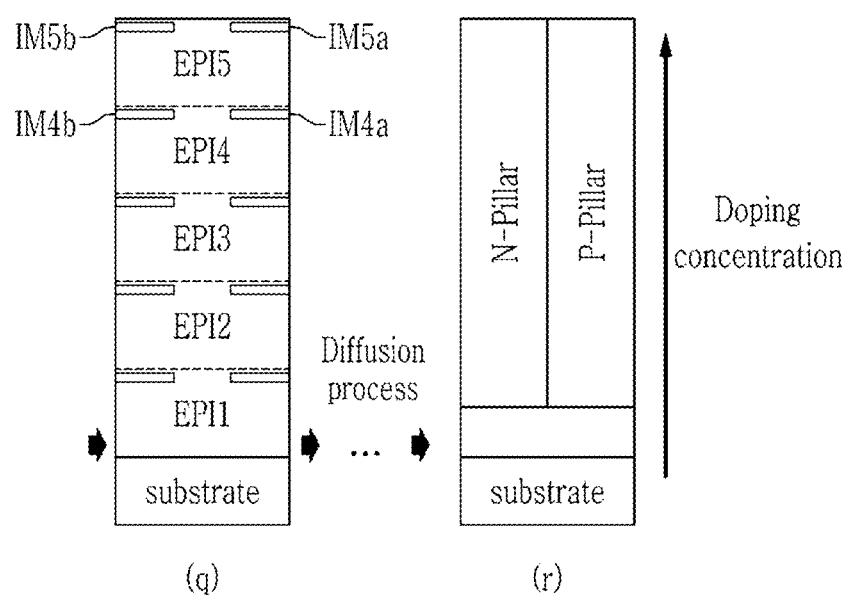

Subsequently, referring to FIG. 25, a fourth epitaxial layer EPI4 to a fifth epitaxial layer EPI5 may be formed on a third epitaxial layer EPI3, and the second epitaxial layer EPI2 to the fifth epitaxial layer EPI5 may have a second doping concentration to a fifth doping concentration that is substantially the same as the first doping concentration.

In addition, the ion injection process is performed with respect to the fourth epitaxial layer EPI4 to the fifth epitaxial layer EPI5 using the above-described method such that a fourth P-type ion injection layer IM4a to a fifth P-type ion injection layer IM5a and a fourth N-type ion injection layer IM4b to a fifth N-type ion injection layer IM5b can be formed. Here, the fourth P-type ion injection layer IM4a to the fifth P-type ion injection layer IM5a may have substantially the same area as the first P-type ion injection layer IM1a to the third P-type ion injection layer IM3a, and the fourth N-type ion injection layer IM4b to the fifth N-type ion injection layer IM5b may be substantially the same as the first N-type ion injection layer IM1b to the third N-type ion injection layer IM3b. In addition, a manufacturing process may be carried out to set a dose of the first P-type ion injection layer IM1a to the smallest, a dose of the fifth P-type ion injection layer IM5a to the largest, and a dose of the second P-type ion injection layer IM2a to a dose of the fourth P-type ion injection layer IM4a to sequentially increase between the dose of the first P-type ion injection layer IM1a and the dose of the fifth P-type ion injection layer IM5a.

In addition, a manufacturing process may be carried out to set a dose of the first N-type ion injection layer IM1b to the smallest, a dose of the fifth N-type ion injection layer IM5b to the largest, and a dose of the second N-type ion injection layer IM2b to a dose of the fourth N-type ion injection layer IM4b to sequentially increase between the dose of the first N-type ion injection layer IM1b and the dose of the fifth N-type ion injection layer IM5n.

As shown in (r), after the formation of the ion injection layer is completed, an N pillar and a P pillar may be formed by performing a diffusion process. The range of the present disclosure is not limited to the manufacturing method illustrated FIG. 15 to FIG. 25, and the manufacturing method may be modified and used according to a specific implementation purpose, and a semiconductor device according to exemplary embodiments of the present disclosure may be manufactured by using two or more of the above-described manufacturing methods together, or any of various manufacturing methods.

Thus, in the semiconductor device described hereinabove according to the exemplary embodiments of the present disclosure, an upper portion with reference to the center of the active region ACT pillar is P-rich and a lower portion is N-rich while the P-type charge amount and the N-type charge amount are balanced near the center of the active region ACT pillar in the vertical direction, and the charge amount is gradually increased in the upper portions of the P pillar and the N pillar in the vertical direction and the charge amount is gradually decreased in the lower portions of the P pillar and the N pillar such that, during a turn-off switching operation, increasing speed of a width of a depletion layer in the upper region of the N pillar according to increase of a drain voltage is set to be slowed down, to thereby accelerate formation of a charge pocket and increase a parasitic capacitance value $C_{GD}$ due to the charge pocket.

Accordingly, the drain voltage $V_{DS}$ can be prevented from being rapidly changed due to the effect of increasing the parasitic capacitance $V_{DS}$ while down-sizing the chip, and thus the EMI characteristic, overshoot of the drain voltage $V_{DS}$, and oscillation or spiking of the gate voltage $V_{GS}$ can be remarkably improved. In addition, the semiconductor device according to the exemplary embodiments of the present disclosure has a unique symmetry that increases the amount of charge in both the P pillar and the N pillar toward the top of the active area (ACT), and decreases the amount of charge in both the P pillar and the N pillar toward the bottom, and thus it is possible to minimize negative effects such as a decrease in $BV_{DSS}$ or a change in the resistance value $R_{DS(ON)}$ of an element device according to the charge amount imbalance. Accordingly, the semiconductor device according to the exemplary embodiments of the present disclosure can secure reliability and stability while realizing down-sizing of the chip.

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

What is claimed is:

1. A semiconductor device comprising:
   a first semiconductor layer having an N-type conductivity; and
   a second semiconductor layer that is formed on the first semiconductor layer,
   wherein an active region is defined in the first semiconductor layer and the second semiconductor layer,
   the active region comprises a plurality of first P pillars and a plurality of first N pillars alternately arranged along a first direction,
   in the active region, an upper pillar region including an upper region of the plurality of first P pillars and an upper region of the plurality of first N pillars, a lower pillar region including a lower region of the plurality of first P pillars and a lower region of the plurality of first N pillars, and a middle pillar region formed between the upper pillar region and the lower pillar region are defined,
   an entire charge amount of the upper pillar region is greater than an entire charge amount of the lower pillar region,
   a P-type charge amount is greater than an N-type charge amount in the upper pillar region, while the N-type charge amount is greater than the P-charge amount in the lower pillar region, and
   from an upper end of the upper pillar region to a lower end of the lower pillar region, each of the P-type charge amount and the N-type charge amount decreases in a repeated form of a plurality of ripples, a ripple having a first portion increasing with a positive slope and a second portion with a negative slope.

2. The semiconductor device of claim 1, wherein the P-type charge amount and the N-type charge amount non-linearly decrease from an upper end of the upper pillar region to a lower end of the lower pillar region.

3. The semiconductor device of claim 1, wherein the middle pillar region comprises a charge amount balanced region where the P-type charge amount and the N-type charge amount are balanced.

4. The semiconductor device of claim 1, further comprising:
   a source electrode formed on the second semiconductor layer; and a drain electrode formed below the first semiconductor layer, wherein a charge pocket is formed in the first N pillar while a drain voltage applied through the drain electrode and the source electrode is increased.

5. The semiconductor device of claim 1, wherein
a frame region is further defined in the first semiconductor layer and the second semiconductor layer, and
the frame region comprises a plurality of second P pillars and a plurality of second N pillars alternately arranged along the first direction.

6. The semiconductor device of claim 1, wherein
a termination region is further defined in the first semiconductor layer and the second semiconductor layer, and
the termination region comprises a plurality of third P pillars and a plurality of third N pillars alternately arranged along the first direction.

7. A semiconductor device comprising:
a first semiconductor layer having N-type conductivity; and
a second semiconductor layer formed on the first semiconductor layer,
wherein an active region is defined in the first semiconductor layer and the second semiconductor layer,
the active region comprises a plurality of first P pillars and a plurality of first N pillars alternately arranged along a first direction,
an upper pillar region including an upper region of the plurality of first P pillars and an upper region of the plurality of first N pillars is defined in the active region,
an entire charge amount of an upper end of the upper pillar region is greater than an entire charge amount of a lower end of the upper pillar region,
a P-type charge amount is greater than an N-type charge amount in the upper pillar region, and
in the upper pillar region, each of the P-type charge amount and the N-type charge amount decreases in a repeated form of a plurality of ripples, a ripple having a first portion increasing with a positive slope and a second portion with a negative slope.

8. The semiconductor device of claim 7, wherein the P-type charge amount and the N-type charge amount non-linearly decrease from the upper end to the lower end of the upper pillar region.

9. A semiconductor device comprising:
a first semiconductor layer having an N-type conductivity; and
a second semiconductor layer that is formed on the first semiconductor layer,
wherein an active region is defined in the first semiconductor layer and the second semiconductor layer,
the active region comprises a plurality of first P pillars and a plurality of first N pillars alternately arranged along a first direction,
a lower pillar region including a lower region of the plurality of first P pillars and a lower region of the plurality of first N pillars is defined in the active region,
an entire charge amount of an upper end of the lower pillar region is greater than an entire charge amount of a lower end of the lower pillar region, and
an N-type charge amount is greater than a P-type charge amount in the lower pillar region, and
in the lower pillar region, each of the P-type charge amount and the N-type charge amount decreases in a repeated form of a plurality of ripples, a ripple having a first portion increasing with a positive slope and a second portion with a negative slope.

10. The semiconductor device of claim 9, wherein the P-type charge amount and the N-type charge amount non-linearly decrease from the upper end to the lower end of the lower pillar region.

* * * * *